United States Patent
Nishibayashi et al.

(10) Patent No.: US 12,084,777 B2
(45) Date of Patent: Sep. 10, 2024

(54) METHOD FOR MANUFACTURING HARD CARBON-BASED COATING, AND MEMBER PROVIDED WITH COATING

(71) Applicants: Sumitomo Electric Industries, Ltd., Osaka (JP); MITSUBISHI MATERIALS CORPORATION, Tokyo (JP); D.N.A. METAL COMPANY, LIMITED, Ibaraki (JP)

(72) Inventors: Yoshiki Nishibayashi, Osaka (JP); Shigeki Maeda, Higashiosaka (JP); Kazutaka Fujiwara, Naka (JP)

(73) Assignees: Sumitomo Electric industries, Ltd., Osaka (JP); MITSUBISHI MATERIALS CORPORATION, Tokyo (JP); D.N.A. METAL COMPANY, LIMITED, Osaka (JP)

( * ) Notice: Subject to any disclaimer, the term of this patent is extended or adjusted under 35 U.S.C. 154(b) by 102 days.

(21) Appl. No.: 16/650,128

(22) PCT Filed: Sep. 11, 2018

(86) PCT No.: PCT/JP2018/033715
§ 371 (c)(1),
(2) Date: Mar. 24, 2020

(87) PCT Pub. No.: WO2019/059054
PCT Pub. Date: Mar. 28, 2019

(65) Prior Publication Data
US 2021/0156033 A1    May 27, 2021

(30) Foreign Application Priority Data

Sep. 25, 2017 (JP) ................................ 2017-184240
Mar. 12, 2018 (JP) ................................ 2018-044133

(51) Int. Cl.
*C23C 14/00* (2006.01)
*C23C 26/00* (2006.01)

(52) U.S. Cl.
CPC .................................... *C23C 26/00* (2013.01)

(58) Field of Classification Search
CPC ................................ C23C 14/00; H01J 37/00
See application file for complete search history.

(56) References Cited

U.S. PATENT DOCUMENTS 4,364,802 A * 12/1982 Inoue ..................... C25D 5/617
205/104
4,504,519 A    3/1985 Zelez
(Continued)

FOREIGN PATENT DOCUMENTS

EP      2949779 A1    12/2015
JP      55028314 A *   2/1980
(Continued)

OTHER PUBLICATIONS

JP 55-028314-A English translated (Year: 1980).*
(Continued)

*Primary Examiner* — Kelly M Gambetta
*Assistant Examiner* — Mohammad Mayy
(74) *Attorney, Agent, or Firm* — Faegre Drinker Biddle & Reath LLP

(57) ABSTRACT

Provided is a method for manufacturing a hard carbon-based coating. The method includes: a step A of preparing a film-forming apparatus including a power supply device and a discharge electrode containing a carbon material, and a substrate having a surface on which a coating is to be formed; and a step B of causing the film-forming apparatus to repeatedly generate a discharge between the discharge electrode and the substrate, to form a hard carbon-based coating on the surface.

3 Claims, 6 Drawing Sheets

(56) References Cited

U.S. PATENT DOCUMENTS

| | | | | |
|---|---|---|---|---|
| 4,603,082 | A | * | 7/1986 | Zelez .................. C03C 23/0055 |
| | | | | 250/492.2 |
| 4,866,237 | A | * | 9/1989 | Inoue .................. B23K 35/327 |
| | | | | 219/76.13 |
| 4,915,977 | A | * | 4/1990 | Okamoto ............ C23C 14/0611 |
| | | | | 427/580 |
| 7,052,736 | B2 | * | 5/2006 | Wei ......................... F41A 21/04 |
| | | | | 427/523 |
| 2003/0175485 | A1 | * | 9/2003 | Takahashi ............ G11B 5/8408 |
| | | | | 428/835.2 |
| 2004/0038033 | A1 | * | 2/2004 | Massler ................ C23C 28/048 |
| | | | | 427/249.7 |
| 2007/0144901 | A1 | * | 6/2007 | Skotheim ............ C23C 14/358 |
| | | | | 204/298.41 |
| 2008/0292812 | A1 | * | 11/2008 | Ramm .................. C23C 16/503 |
| | | | | 427/570 |
| 2014/0054165 | A1 | | 2/2014 | Ramm et al. |
| 2014/0076716 | A1 | * | 3/2014 | Gorokhovsky ......... C23C 14/35 |
| | | | | 204/192.12 |

FOREIGN PATENT DOCUMENTS

| | | | |
|---|---|---|---|
| JP | S58-79807 A | | 5/1983 |
| JP | 2002-115080 A | | 4/2002 |
| JP | 2005-152909 A | | 6/2005 |
| JP | 2005-307288 A | | 11/2005 |
| JP | 2010-132951 A | | 6/2010 |
| WO | WO 98-41666 | * | 9/1998 ............. C23C 14/00 |
| WO | WO 98/41666 A1 | | 9/1998 |

OTHER PUBLICATIONS

Osada, Minoru et al., "Application of Raman spectroscopy to characterization of carbon-based materials: Recent advances and their applications to nano-carbons," TANSO, 2007 [No. 228] pp. 174-184.

English translation fo Written Opinion of the International Searching Authority mailed Dec. 11, 2018 for PCT/JP/2018/033715.

* cited by examiner

METHOD FOR MANUFACTURING HARD CARBON-BASED COATING, AND MEMBER PROVIDED WITH COATING

TECHNICAL FIELD

The present disclosure relates to a method for manufacturing a hard carbon-based coating and a member provided with coating.

This application claims priority based on Japanese Patent Application No. 2017-184240 filed on Sep. 25, 2017 and Japanese Patent Application No. 2018-044133 filed on Mar. 12, 2018. All described contents described in Japanese Patent Applications are incorporated.

BACKGROUND ART

A carbon material coating containing diamond, diamond-like carbon (DLC), carbon nanotube (CNT), or fullerene ($C_{60}$, $C_{70}$, $C_{74}$ or the like) or the like is used as a coating material on a tool surface, a sliding component surface, a corrosion-resistant component surface, an acid/alkali-resistant component surface, or an electrode material surface or the like.

As a method for manufacturing a coating, film forming methods such as chemical vapor deposition (CVD) and physical vapor deposition (PVD) are generally used.

Meanwhile, as disclosed in PTL 1, a technique for repairing cracks, scratches, or worn portions in a tool surface by a discharge is known. This principle is that a metal as one electrode is melted in a moment by the energy of the discharge, and is drawn into a substrate (tool or component) facing the other to form and deposit a film. This method has been known as a method for forming a coating composed of a high melting point metal or the like.

CITATION LIST

Patent Literature

PTL 1: Japanese Patent Laying-Open No. 2010-132951

SUMMARY OF INVENTION

A method for manufacturing a hard carbon-based coating according to the present disclosure, the method comprising:

a step A of preparing a film-forming apparatus including a power supply device and a discharge electrode containing a carbon material, and a substrate having a surface on which a coating is to be formed; and a step B of causing the film-forming apparatus to repeatedly generate a discharge between the discharge electrode and the substrate, to form a hard carbon-based coating on the surface.

A member provided with coating of the present disclosure comprising:

a substrate; and a hard carbon-based coating formed on at least a part of the substrate, wherein a peak position X in a Raman spectrometric method of the hard carbon-based coating, and a half-value width W at the peak position satisfy the following condition: $38 \text{ cm}^{-1} < W < 500 \text{ cm}^{-1}$ $$16 \times (X-1347.5) + 39 < W < 16 \times (X-1335) + 39$$

$X < 1370 \text{ cm}^{-1}$.

A member provided with coating of the present disclosure comprising:

a substrate; and a hard carbon-based coating formed on at least a part of the substrate, wherein a ratio D/G of peak intensity of a D band to peak intensity of a G band in a Raman spectrometric method of the hard carbon-based coating and a half-value width W in the D band satisfy $W < 50 \text{ cm}^{-1}$ and $D/G > 10.5$, or $W \leq 115 \text{ cm}^{-1}$, $D/G < 9.0$, and $80/(D/G)^{0.5} < W < 180/(D/G)^{0.5}$, or $115 \text{ cm}^{-1} < W < 500 \text{ cm}^{-1}$ and $D/G < 2.8$.

A member provided with coating of the present disclosure comprising:

a substrate; and a hard carbon-based coating formed on at least a part of the substrate, wherein:

the hard carbon-based coating includes a site having a D band peak and a G band peak in a Raman spectrometric method, and further includes at least one of a site where a peak position in the Raman spectrometric method is $910 \pm 50 \text{ cm}^{-1}$, a site where a peak position in the Raman spectrometric method is $810 \pm 30 \text{ cm}^{-1}$, a site where a peak position in the Raman spectrometric method is $705 \pm 30 \text{ cm}^{-1}$, a site where a peak position in the Raman spectrometric method is $535 \pm 30 \text{ cm}^{-1}$, a site where a peak position in the Raman spectrometric method is $260 \pm 20 \text{ cm}^{-1}$, a site where a peak position in the Raman spectrometric method is $210 \pm 20 \text{ cm}^{-1}$, a site where a peak position in the Raman spectrometric method is $135 \pm 20 \text{ cm}^{-1}$, a site where a peak position in the Raman spectrometric method is $95 \pm 10 \text{ cm}^{-1}$, and a site where a peak position in the Raman spectrometric method is $2327 \pm 10 \text{ cm}^{-1}$.

A member provided with coating of the present disclosure comprising:

a substrate; and a hard carbon-based coating formed on at least a part of the substrate, wherein the hard carbon-based coating includes at least one of a site where a peak position in a Raman spectrometric method is greater than or equal to $1335 \text{ cm}^{-1}$ and less than or equal to $1349 \text{ cm}^{-1}$, and a half-value width at the peak position is greater than or equal to $30 \text{ cm}^{-1}$ and less than or equal to $95 \text{ cm}^{-1}$, a site where a peak position in the Raman spectrometric method is greater than or equal to $1349 \text{ cm}^{-1}$ and less than or equal to $1370 \text{ cm}^{-1}$, and a half-value width at the peak position is greater than or equal to $95 \text{ cm}^{-1}$ and less than or equal to $350 \text{ cm}^{-1}$, and a site where a peak position in the Raman spectrometric method is greater than or equal to $1300 \text{ cm}^{-1}$ and less than or equal to $1335 \text{ cm}^{-1}$, and a half-value width at the peak position is greater than or equal to $1 \text{ cm}^{-1}$ and less than or equal to $29 \text{ cm}^{-1}$.

DETAILED DESCRIPTION

Figure 1:
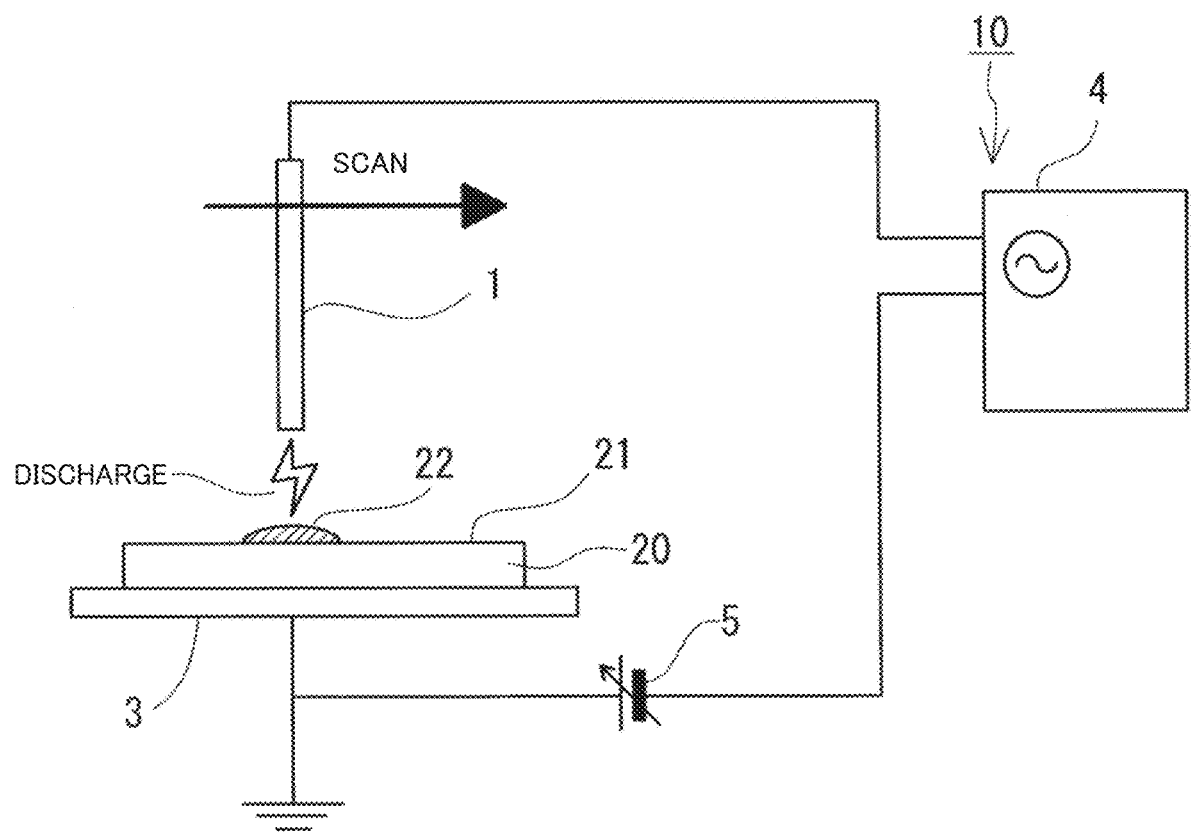
FIG. 1 is an illustration showing a method for manufacturing a hard carbon-based coating using a first film-forming apparatus.

Problem to be Solved by the Present Disclosure

Film formation of a conventional hard carbon-based coating requires special equipment for performing CVD or PVD or the like. The film formation requires cost and time, so that a simpler method is desired. The method of PTL 1 is a method in which a metal material that is the same as that of a tool or a component substrate is formed by a discharge, and has not been attempted as a coating of a carbon-based material (a material mainly composed of carbon).

When the formation of a hard carbon-based coating is considered, a relatively soft carbon electrode is used. Here, "soft" means that a carbon bond is weak, which causes a physically low hardness. The carbon electrode is an electrode having a high-conductivity SP2 bond and many SP2-like bonds, or many n bonds. Therefore, the coating formed on the substrate is also a coating having many SP2 bonds, SP2-like bonds, or n bonds. In many applications, including tools, a coating is hard as important properties. Here, the SP2-like bond is a bond in which a peak position is the same as that of the SP2 bond, and the half-value width of the peak position is larger than the SP2 bond in a spectrum obtained by a Raman spectrometric method. The half-value width of the ordered SP2 bond is as small as less than 20 cm$^{-1}$, but the half-value width increases when the bond order is disturbed. Even a bond having a larger half-value width than the SP2 bond has physical properties similar to those of the SP2 bond, and is referred to as an SP2-like bond in the present specification.

Accordingly, an object of the present disclosure is to provide a method for manufacturing a hard carbon-based coating that can easily form a hard carbon-based coating. Another object of the present disclosure is to provide a member provided with coating in which a hard carbon-based coating is formed on a substrate.

Advantageous Effects of Present Disclosure

According to a method for manufacturing a hard carbon-based coating, a hard coating can be easily formed.

The member provided with coating includes a carbon-based coating that is harder than a conventional member.

Embodiment of Present Disclosure

The contents of an embodiment of the present disclosure will be listed and described.

A carbon atom bond includes an SP2 bond, an SP2-like bond, a π bond, an SP3 bond, or an SP3-like bond. Here, the SP2-like bond is a bond showing physical characteristics similar to those of the SP2 bond, and the SP3-like bond is a bond showing physical characteristics similar to those of the SP3 bond. As described later, these bonds can be distinguished by the peak position of a spectrum obtained in a Raman spectrometric method, or by the peak position and a half-value width (half value full width) at the peak position. The SP2 bond and the SP2-like bond are observed in relatively soft carbon materials such as graphite. The n bond is also observed in the relatively soft carbon material. Meanwhile, the SP3 bond and the SP3-like bond are observed in a hard carbon material such as diamond. The SP2 bond or the SP2-like bond of the plane bond is bent into a curved form, so that the SP3 bond or the bond close to the SP3-like bond is also observed in a relatively hard carbon material. Examples of the bond in which the SP2 bond or the SP2-like bond is bent in a curve form include a bond that forms a bond loop in a minute region such as carbon nanotube or fullerene. It can be said that such a carbon bond is not planar like the SP2 bond, but an SPx bond ($2<x<3$) or an SPx-like bond ($2<x<3$). If the carbon bond of the hard carbon-based coating deviates from the SP2 bond, the ratio of the π bond of the hard carbon-based coating also decreases to provide a harder carbon-based coating.

As described above, if the carbon-based coating has high ratios of the SP3 bond, the SP3-like bond, the SPx bond, and the SPx-like bond of carbon atoms, a hard carbon-based coating is provided. The present inventors have intensively studied a method allowing such a hard carbon-based coating to be easily and efficiently formed. As a result, the idea of forming a hard carbon-based coating containing at least one of the SP3 bond, the SP3-like bond, the SPx bond, and the SPx-like bond can be obtained by repeatedly performing a discharge using a high conductivity carbon electrode having high ratios of the SP2 bond, the SP2-like bond, and the n bond. Hereinafter, a method for manufacturing a hard carbon-based coating and a member provided with coating that includes the hard carbon-based coating will be described in detail.

(1) A method for manufacturing a hard carbon-based coating according to an embodiment, the method comprising:

a step A of preparing a film-forming apparatus including a power supply device and a discharge electrode containing a carbon material, and a substrate having a surface on which a coating is to be formed; and a step B of causing the film-forming apparatus to repeatedly generate a discharge between the discharge electrode and the substrate, to form a hard carbon-based coating on the surface.

According to the method for manufacturing a hard carbon-based coating, the hard carbon-based coating can be formed on the surface of the substrate by a simple operation that merely repeatedly generates the discharge between the conductive discharge electrode containing the carbon material and the substrate. As the conductive carbon material, inexpensive and easily available conductive carbon materials such as graphite can be utilized, which provides excellent productivity of the hard carbon-based coating also on the point.

Here, the hard carbon-based coating is a hard coating mainly composed of carbon or a hard coating containing carbon as an accessory component. The coating mainly composed of carbon is a coating having a carbon content of greater than or equal to 50 atom % in the coating. The coating containing carbon as an accessory component is a coating having a carbon content of greater than 10 atom % and less than 50 atom % in the coating. The hard coating is a coating in which carbon contained in the coating has at least one of an SP3 bond, an SP3-like bond, an SPx bond ($2<x<3$), and an SPx-like bond ($2<x<3$).

The hard coating is, for example, a coating that satisfies the measurement results of a Raman spectrometric method specified in the item of a member provided with covering to be described later. More specifically, examples of the hard carbon-based coating include a coating composed of diamond, tetrahedral amorphous carbon, and carbon nanotube that contain 100% of carbon. Another examples of the hard carbon-based coating include a carbon-based coating containing less than 100% of carbon, such as a carbon nitride (CN) or boron carbon nitride (BCN) coating, Furthermore, a coating containing a fibrous carbon material (including carbon nanotube and the like) having a high tensile strength or a conductive carbon material (including an SP2 bond portion, an SP2-like bond portion, and fullerene and the like) is also included in the hard carbon-based coating of the present disclosure. The hard carbon-based coating containing the fibrous carbon material has an effect of improving the bending strength of a member on which the hard carbon-based coating is formed. The conductive carbon material contained in the hard carbon-based coating can function as a lubricant. Such a hard carbon-based coating can be utilized as a coating formed on a tool, a mold, a sliding member, a corrosion-resistant member, or an electrode member or the like.

(2) As one aspect of the method for manufacturing a hard carbon-based coating according to an embodiment, the following aspect may be provided: the power supply device is an AC power source; and an AC voltage applied to the discharge electrode may be greater than or equal to 3.6 kV.

The use of the AC power source as the power supply device makes it possible to repeatedly generate the discharge when the voltage of the discharge electrode increases. A negative bias potential may be applied to the substrate side. The bias potential may be a self-bias potential or a bias potential applied to the substrate from the outside. The discharge electrode may be vibrated to prompt the generation of a periodic discharge.

As a result of the examination by the present inventors, it has been found to be important to impart a large energy, which cannot be conventionally considered, efficiently in a moment and to freeze the coupling of a high energy state earlier, during a repeated discharge. Therefore, in the above configuration, a high AC voltage of greater than or equal to 3.6 kV is applied to the discharge electrode. Such a voltage imparts a larger energy between an electrode and a substrate than that in a conventional method for forming a metal material such as a tungsten coating on the substrate. By using such a voltage, the constituent material of a carbon electrode having high ratios of an SP2 bond and an SP2-like bond can be converted into a hard carbon-based coating having high ratios of an SP3 bond and an SP3-like bond.

(3) In an aspect of the method for manufacturing a hard carbon-based coating according to an embodiment, the power supply device is a DC power source;

a DC voltage applied to the discharge electrode is greater than or equal to 3.6 kV; and the discharge electrode is periodically vibrated to generate a discharge having a pulse width of less than 100 milliseconds.

By applying a high DC voltage of greater than or equal to 3.6 kV to the discharge electrode, the constituent material of the carbon electrode having high ratios of an SP2 bond and an SP2-like bond can be changed to a hard carbon-based coating having high ratios of an SP3 bond and an SP3-like bond as in the above (2). The discharge can be continuously maintained by vibrating the discharge electrode with respect to the substrate, which allows the hard carbon-based coating to be continuously formed over a wide range. Also in this configuration, a negative bias potential may be applied to the substrate side.

(4) As an aspect of the method for manufacturing a hard carbon-based coating according to an embodiment, the following aspect may be provided: the film-forming apparatus includes:

a charge circuit storing electric power from the power supply device;

a discharge circuit discharging the electric power of the charge circuit in a pulse form; and a discharge control unit controlling the discharge circuit so as to generate a discharge having a pulse width of less than 1 millisecond when a voltage between the discharge electrode and the substrate is greater than 125 V, or a discharge having a pulse width of less than 10 microseconds when a voltage between the discharge electrode and the substrate is greater than 50 V.

As shown in the above configuration, by applying a voltage of greater than or equal to a predetermined level between the discharge electrode and the substrate in a very short time, the constituent material of a carbon electrode having high ratios of an SP2 bond and an SP2-like bond can be converted into a hard carbon-based coating having high ratios of an SP3 bond and an SP3-like bond as in the above (2) and (3). Also in the present configuration, the discharge electrode may be vibrated, or a negative bias potential may be applied to the substrate side.

(5) As an aspect of the method for manufacturing a hard carbon-based coating according to an embodiment, the following aspect may be provided: the substrate is composed of cemented carbide, an iron-based material, a boron carbon nitride-based material, a cubic boron nitride-based material, cermet, a Ni-based material, or conductive ceramic.

The materials listed in the above (5) are mainly constituent materials for tools. Therefore, according to the structure, a tool (member provided with coating) having a hard carbon-based coating can be prepared.

(6) As an aspect of the method for manufacturing a hard carbon-based coating according to an embodiment, the following aspect may be provided: the discharge electrode is a carbon material containing greater than or equal to 90% by mass of carbon.

Greater than or equal to 90% by mass of carbon is contained in the discharge electrode, whereby the hard carbon-based coating is likely to be formed, to allow the ratios of the SP3 bond and the SP3-like bond in the hard carbon-based coating to be increased. A low purity carbon electrode containing a large amount of a binder for curing the carbon material makes it difficult to form a hard carbon-based coating having the SP3 bond and the SP3-like bond.

(7) A member provided with coating according to an embodiment comprising:

a substrate; and a hard carbon-based coating formed on at least a part of the substrate, wherein a peak position X in a Raman spectrometric method of the hard carbon-based coating, and a half-value width W at the peak position satisfy the following condition: $38 \text{ cm}^{-1} < W < 500 \text{ cm}^{-1}$ $$16 \times (X-1347.5)+39 < W < 16 \times (X-1335)+39$$

$X < 1370 \text{ cm}^{-1}$.

In the spectrum obtained by the Raman spectrometric method using a laser having an excitation wavelength of 532 nm, the SP3 bond forms a sharp peak (half-value width: less than 20 cm$^{-1}$) at a position of greater than or equal to 1325 cm$^{-1}$ and less than 1335 cm$^{-1}$. When the order of the SP3 bond is disturbed, the peak position is at greater than or equal to 1335 cm$^{-1}$ and less than 1400 cm$^{-1}$, and the half-value width is also increased (greater than or equal to 20 cm$^{-1}$). In the present specification, a bond in which the peak is shifted to a position adjacent to the peak of the SP3 bond and the half-value width is increased is referred to as an SP3-like bond. Here, in a peculiar case, even when the peak position is at greater than or equal to 1335 cm$^{-1}$ and less than 1400 cm$^{-1}$, a carbon material bond having a small half-value width (less than cm$^{-1}$) may be obtained. This is the SP3-like bond with improved order of the SP3 bond, and is included in the SP3-like bond of the present disclosure. Since this peculiar SP3-like bond contributes to improvement in the hardness of the hard carbon-based coating, the SP3-like bond is suitable as a coating for a tool. Meanwhile, in the spectrum obtained by the Raman spectrometric method, the SP2 bond forms a peak having a half-value width of less than 20 cm$^{-1}$ at a position of greater than or equal to 1500 cm$^{-1}$ and less than 1650 cm$^{-1}$. When the order of the SP2 bond is disturbed, the peak position does not change (greater than or equal to 1500 cm$^{-1}$ and less than 1650 cm$^{-1}$), but the half-value width is increased to greater than or equal to 20 cm$^{-1}$. In the present specification, a bond having a larger half-value width than that of the SP2 bond is referred to as an SP2-like bond. In view of the definition of each of these bonds, if the results of measuring the hard carbon-based coating by the Raman spectrometric method satisfy the range described in the above (7), at least the SP3 bond and the SP3-like bond in the hard carbon-based coating can be determined to be formed. The lower limit value of X is preferably 1335 cm$^{-1}$.

(8) A member provided with coating according to an embodiment comprising:
a substrate; and
a hard carbon-based coating formed on at least a part of the substrate,
wherein a ratio D/G of peak intensity of a D band to peak intensity of a G band in a Raman spectrometric method of the hard carbon-based coating and a half-value width W in the D band satisfy W<50 cm$^{-1}$ and D/G>10.5, or W≤115 cm$^{-1}$, D/G<9.0, and 80/(D/G)$^{0.5}$<W<180/(D/G)$^{0.5}$, or 115 cm$^{-1}$<W<500 cm$^{-1}$ and D/G<2.8.

In general, a peak formed near 1360 cm$^{-1}$ in a Raman spectrometric method is referred to as a D band, and a peak formed near 1580 cm$^{-1}$ is referred to a G band. In the present specification, a peak formed at greater than or equal to 1325 cm$^{-1}$ and less than 1400 cm$^{-1}$ is referred to the D band, and a peak formed at greater than or equal to 1500 cm$^{-1}$ and less than 1650 cm$^{-1}$ is referred to the G band. That is, the D band corresponds to the SP3 bond and the SP3-like bond, and the G band corresponds to the SP2 bond and the SP2-like bond. Therefore, if the peak intensity ratio D/G of both the bands, and the half-value width W in the D band satisfy the above range, the SP3 bond and the SP3-like bond can be determined to be formed in the hard carbon-based coating. A high D/G indicates many SP3 bonds and SP3-like bonds in the hard carbon-based coating, whereby the lower limit value of D/G is preferably greater than or equal to 1.0, more preferably greater than or equal to 1.5, and still more preferably greater than or equal to 2.0. In a peculiar case, even when the peak position is greater than or equal to 1335 cm$^{-1}$ and less than 1400 cm$^{-1}$, a carbon material bond having a small half-value width (less than 20 cm$^{-1}$) and D/G of greater than or equal to 100 may be obtained. This is the SP3-like bond with improved order of the SP3 bond, and is included in the SP3-like bond of the present disclosure. Since this peculiar SP3-like bond contributes to improvement in the hardness of the hard carbon-based coating, the SP3-like bond is suitable as a coating for a tool. However, if the hard carbon-based coating contains a site of greater than or equal to the lower limit value at a surface ratio of greater than or equal to 10%, the remaining portion may have D/G of greater than or equal to 0.2. If the hard carbon-based coating contains greater than or equal to 10% of a hard site, the hard portion causes percolation in the coating. Therefore, the hard carbon-based coating is supported by the hard portion included in the coating, and is less likely to be worn. Here, the area ratio can be determined utilizing a color-coded Raman image or a Raman image shading-displayed in black and white. About four levels of the contrasting density of the Raman image are appropriate. In the production of the Raman image, a contrasting density image of greater than or equal to five levels reflecting the intensity of a peak is preferably set to about four levels reflected from the spectrum obtained by the Raman spectrometric method by image processing. The peak position of the spectrum can be accurately obtained by subtracting the background from the spectrum and fitting with a Gaussian distribution. The background is obtained as follows, for example. First, a portion showing a maximum value (temporary peak) is identified from the spectrum. If the half-value width of the temporary peak is greater than or equal to 30 cm$^{-1}$, the background is a tangent line drawn to be brought into contact with a minimum value where a spectrum curve is convex downward within a range of 600 cm$^{-1}$ around the temporary peak. If the half-value width of the temporary peak is less than or equal to 10 cm$^{-1}$, the background is a tangent line drawn to be brought into contact with a minimum value where the curve of the spectrum is convex downward is drawn within a range of three times the half-value width around the temporary peak. When the background does not have a large slope, the peak and the maximum value almost coincide with each other. At the peaks of less than or equal to 500 cm$^{-1}$, the background has a large slope.

(9) A member provided with coating according to an embodiment comprising:
a substrate; and
a hard carbon-based coating formed on at least a part of the substrate,
wherein:
the hard carbon-based coating includes a site having a D band peak and a G band peak in a Raman spectrometric method, and further includes at least one of
(a) a site where a peak position in the Raman spectrometric method is 910±50 cm$^{-1}$,
(b) a site where a peak position in the Raman spectrometric method is 810±30 cm$^{-1}$,
(c) a site where a peak position in the Raman spectrometric method is 705±30 cm$^{-1}$,
(d) a site where a peak position in the Raman spectrometric method is 535±30 cm$^{-1}$,
(e) a site where a peak position in the Raman spectrometric method is 260±20 cm$^{-1}$,
(f) a site where a peak position in the Raman spectrometric method is 210±20 cm$^{-1}$,
(g) a site where a peak position in the Raman spectrometric method is 135±20 cm$^{-1}$,
(h) a site where a peak position in the Raman spectrometric method is 95±10 cm$^{-1}$, and
(i) a site where a peak position in the Raman spectrometric method is 2327±10 cm$^{-1}$.

Each of the above (a) to (i) is a site having a peak value of greater than or equal to ⅕ of the peak height of the D band, and more preferably a site having a peak value of greater than or equal to ⅓ (hereinafter referred to as an N band area). This N band area is considered to be a portion where an SPx bond such as carbon nanotube or fullerene, or an SPx-like bond is formed. The hard carbon-based coating preferably includes at least two of (a) to (d) or at least two of (e) to (i). More preferably, the hard carbon-based coating includes at least two of (a) to (d) and at least two of (e) to (i).

The hard carbon-based coating includes a portion having a D band peak and a G band peak in a Raman spectrometric method, and an N band area. The hard carbon-based coating including the N band area improves the bending strength of the member provided with coating. Such a hard carbon-based coating is suitable as a coating for a tool or an electrode material. The area ratio of the N band area in the planar area of the hard carbon-based coating may be greater than or equal to 0.1% and less than or equal to 99%. The lower limit value of the area ratio of the N band area is preferably greater than or equal to 1%, and more preferably greater than or equal to 5%. The upper limit value of the area ratio of the N band area is preferably less than or equal to 80%, and more preferably less than or equal to 60%. The hard carbon-based coating satisfying the area ratio is preferable as a tool or an electrode.

(10) A member provided with coating according to an embodiment comprising:

a substrate; and a hard carbon-based coating formed on at least a part of the substrate, wherein the hard carbon-based coating includes at least one of

[A] a site where a peak position in a Raman spectrometric method is greater than or equal to 1335 $cm^{-1}$ and less than or equal to 1349 $cm^{-1}$, and a half-value width at the peak position is greater than or equal to 30 $cm^{-1}$ and less than or equal to 95 $cm^{-1}$,

[B] a site where a peak position in the Raman spectrometric method is greater than or equal to 1349 $cm^{-1}$ and less than or equal to 1370 $cm^{-1}$, and a half-value width at the peak position is greater than or equal to 95 $cm^{-1}$ and less than or equal to 350 $cm^{-1}$, and

[C] a site where a peak position in the Raman spectrometric method is greater than or equal to 1300 $cm^{-1}$ and less than or equal to 1335 $cm^{-1}$, and a half-value width at the peak position is greater than or equal to 1 $cm^{-1}$ and less than or equal to 29 $cm^{-1}$.

In the hard carbon-based coating obtained by the method for manufacturing a hard carbon-based coating according to an embodiment, sites having different carbon atom bonding states may be formed in a marble or granular form. If any of the above [A], [B], and [C] is satisfied when the bonding state of the carbon atom at each site is measured by the Raman spectrometric method, the bonding state of the carbon atom of the site is recognized to be the SP3 bond or the SP3-like bond. Of course, the hard carbon-based coating may be composed of only any of [A], [B], and [C]. Among these, the inclusion of at least [A] is more preferable than a combination not containing [A]. This is because [A] has intermediate characteristics between [B] and [C], and thus has good affinity for [B] and [C].

(11) As an aspect of the member provided with coating of the above (7), (8), or (10), the following aspect may be provided:

the hard carbon-based coating further comprises at least one of (a) a site where a peak position in the Raman spectrometric method is 910±50 $cm^{-1}$, (b) a site where a peak position in the Raman spectrometric method is 810±30 $cm^{-1}$, (c) a site where a peak position in the Raman spectrometric method is 705±30 $cm^{-1}$, (d) a site where a peak position in the Raman spectrometric method is 535±30 $cm^{-1}$, (e) a site where a peak position in the Raman spectrometric method is 260±20 $cm^{-1}$, (f) a site where a peak position in the Raman spectrometric method is 210±20 $cm^{-1}$, (g) a site where a peak position in the Raman spectrometric method is 135±20 $cm^{-1}$, (h) a site where a peak position in the Raman spectrometric method is 95±10 $cm^{-1}$, and (i) a site where a peak position in the Raman spectrometric method is 2327±10 $cm^{-1}$.

The hard carbon-based coating preferably includes at least two of (a) to (d) or at least two of (e) to (i). More preferably, the hard carbon-based coating includes at least two of (a) to (d) and at least two of (e) to (i). Since the above (a) to (i) have strong tensile characteristics, the toughness of the hard carbon-based coating containing hard [A], [B], and [C] is improved.

(12) As an aspect of the member provided with coating according to an embodiment, the following aspect may be provided: the hard carbon-based coating contains greater than or equal to 5 atom % and less than or equal to 60 atom % of nitrogen.

Examples of the hard carbon-based coating containing nitrogen include carbon nitride. This hard carbon-based coating is suitable, for example, as a coating for a tool.

(13) As an aspect of the member provided with coating according to an embodiment, the following aspect may be provided: the hard carbon-based coating contains greater than or equal to 5 atom % and less than or equal to 50 atom % of boron.

Examples of the hard carbon-based coating containing boron include boron carbon nitride. This hard carbon-based coating is suitable, for example, as a coating for a tool.

(14) As an aspect of the member provided with coating according to an embodiment, the following aspect may be provided: the hard carbon-based coating contains aluminum, silicon, and phosphorus in a total amount of greater than or equal to 5 atom % and less than or equal to 50 atom %.

Aluminum, silicon, and phosphorus form a carbide to improve the hardness and crack resistance of the hard carbon-based coating.

(15) As an aspect of the member provided with coating according to an embodiment, the following aspect may be provided: the hard carbon-based coating has a surface roughness Ra of greater than or equal to 0.1 μm.

The surface roughness Ra of the hard carbon-based coating is a value reflecting the surface roughness Ra of the substrate. Therefore, if the surface roughness Ra of the hard carbon-based coating is greater than or equal to 0.1 μm, predetermined irregularities are present in the surface of the substrate, and the contact area between the substrate and the hard carbon-based coating is sufficiently large, whereby the coating has improved adhesiveness to the substrate. Here, the surface roughness Ra of the hard carbon-based coating is a surface roughness Ra that can be generally evaluated with an optical microscope having a function of measuring irregularities. The surface roughness of the substrate exposed after removing the hard carbon-based coating in an oxygen-containing atmosphere or plasma can be measured.

However, the coating is removed under the condition that a rate at which the hard carbon-based coating is removed is 5 times or more than a rate at which the substrate is removed. In addition, the irregularities of the substrate can also be measured by exposing the cross section of the member provided with coating, and observing the cross section under a microscope.

(16) As an aspect of the member provided with coating according to an embodiment, the following aspect may be provided: the substrate has a surface roughness Ra of greater than or equal to 0.1 µm.

If the surface roughness Ra of the substrate is greater than or equal to 0.1 µm, the junction area between the substrate and the hard carbon-based coating increases, whereby the hard carbon-based coating is less likely to be peeled off.

(17) As an aspect of the member provided with coating according to an embodiment, the following aspect may be provided: the hard carbon-based coating has an average particle size of less than or equal to 10 µm.

If the average particle size of the hard carbon-based coating is less than or equal to 10 µm, the toughness of the hard carbon-based coating can be improved. In the manufacturing method of the present embodiment, coating particles are formed in an uncoordinated fashion at different positions on the surface of the substrate in accordance with a discharge, and the coating particles are connected to form the hard carbon-based coating. Therefore, when the hard carbon-based coating is observed with a scanning electron microscope or an optical microscope, a boundary that can be recognized as a grain boundary is present. This boundary is formed by a sudden change in the slope of surface irregularities between coating particles formed at a certain moment and coating particles formed at another moment. The maximum diameter and minimum diameter of the coating particles observed with a microscope can be calculated, and the arithmetic average thereof is defined as the particle size of one coating particle. An arbitrary field of view of 100 µm square of the hard carbon-based coating is observed, and the average particle size of the coating particles in the field of view for observation is defined as the average particle size of the hard carbon-based coating. The field of view may be extracted based on, for example, the center of gravity of the coated region of the member provided with coating. The field of view is extracted at a plurality of different locations (for example, greater than or equal to 3 and less than or equal to 10) in the plane direction of the hard carbon-based coating, and the average of the particle sizes in all the extracted fields of view is preferably defined as the average particle size of the hard carbon-based coating. For example, a straight line that passes through the center of gravity and includes the edge part of the hard carbon-based coating that is farthest from the center of gravity and a straight line that is orthogonal to the straight line are defined. A total of five fields of view of one point as the center of gravity and one point at a center of each line segment extending from the center of gravity to the edge part of the hard carbon-based coating are extracted. Here, the center of gravity in the present specification is not the center of mass but the center of gravity of a planar figure (two-dimensional center of gravity) when the coated region is two-dimensionally viewed. In addition, the average particle size may be obtained by determining the boundary with the mapping function or imaging function of a Raman spectroscopic device.

(18) As an aspect of the member provided with coating according to an embodiment, the following aspect may be provided:

the substrate is cemented carbide; and
the member provided with coating includes an intermediate layer containing at least one of Ni, Ti, Zr, Hf, Nb, Ta, Mo, and W between the substrate and the hard carbon-based coating.

By providing the intermediate layer, the peeling-off of the hard carbon-based coating can be suppressed. The intermediate layer prevents mutual diffusion between the substrate material and the carbon material, to provide an effect of preventing the hard carbon material from being less likely to be formed.

(19) As an aspect of the member provided with coating according to an embodiment, the following aspect may be provided:

the substrate is cemented carbide; and the member provided with coating includes an intermediate layer including at least one of TiN, ZrN, HfN, NbN, TaN, NbC, TaC, MoC, and WC between the substrate and the hard carbon-based coating.

By providing the intermediate layer, the peeling-off of the hard carbon-based coating can be suppressed. This intermediate layer may be already nitrided or carbonized unlike the intermediate layer (16), whereby mutual diffusion between the substrate material and the hard carbon-based coating can be prevented.

Here, the method for manufacturing a hard carbon-based coating of the present embodiment has an advantage that the temperature of the substrate during film formation can be set to room temperature. This provides an advantage that a hard carbon-based coating having a different coefficient of thermal expansion from that of the substrate is likely to be formed on the substrate. However, the discharge locally provides a high temperature state, whereby a difference in thermal expansion between the substrate and the hard carbon-based coating is not completely negligible, and the hard carbon-based coating may be less likely to be formed on the substrate. The intermediate layer exhibits an effect of preventing the hard carbon material from being less likely to be formed by the difference in thermal expansion between the substrate and the hard carbon-based coating.

DETAILS OF EMBODIMENT OF PRESENT DISCLOSURE

Embodiment 1

Hereinafter, embodiments of a method for manufacturing a hard carbon-based coating of the present disclosure and a member provided with coating will be described with reference to the drawings. The drawings are schematic diagrams for clarifying the description unless otherwise specified. Therefore, the sizes and positional relationships and the like of the members are exaggerated or described at easily viewable ratios. Portions denoted by the same reference numerals in a plurality of drawings indicate the same portions or members. For the convenience of the reference to the drawings and the description, terms indicating upper, lower, right, and left directions and position relationships are used as necessary. These terms are used for facilitating understanding of the invention, and the meaning of such terms does not limit the technical scope of the present disclosure.

<<Method for Manufacturing Hard Carbon-Based Coating>>

A method for manufacturing a hard carbon-based coating according to an embodiment repeatedly generates a discharge between a carbon electrode and a substrate, to form a hard carbon-based coating on the surface of a substrate. Specific manufacturing methods are three methods of (1) a method utilizing AC, (2) a method utilizing DC, and (3) a method utilizing a pulse voltage.

(1) Manufacturing Method Utilizing AC

FIG. 1 is a diagram for illustrating a method for manufacturing a hard carbon-based coating utilizing AC. A film-forming apparatus 10 shown in FIG. 1 includes a discharge electrode 1, a support electrode 3 that supports a substrate 20, a power supply device 4, and a bias power supply 5. In the present example, substrate 20 is installed on support electrode 3, and discharge electrode 1 is brought close to substrate 20, to cause power supply device 4 to apply an AC voltage between discharge electrode 1 and support electrode 3. Furthermore, in the present example, a bias potential at which support electrode 3 has a negative potential is applied by a bias power source 5, to attract the electrode material of discharge electrode 1 to the side of substrate 20. Bias power supply 5 may be omitted. By applying the AC voltage to discharge electrode 1 with film-forming apparatus 10, a hard carbon-based coating 22 composed of the electrode material of discharge electrode 1 can be formed on a surface 21 of substrate 20. By causing discharge electrode 1 to scan surface 21 of substrate 20 in parallel while applying the AC voltage to discharge electrode 1, hard carbon-based coating 22 can be formed over a wide range. The scanning may be automatically performed using an apparatus capable of scanning surface 21 or may be manually performed.

The AC voltage of power supply device 4 is preferably greater than or equal to 3.6 kV. This is higher by 20% or more than an AC voltage in a conventional coating method of a high melting point metal (a metal having a melting point higher than 1500° C.). The AC voltage in the conventional high melting point metal coating method is greater than or equal to about 1 kV and less than or equal to about 3 kV. In the coating of the high melting point metal, if the AC voltage is less than 1 kV, a current during a discharge is small, so that the high melting point metal is less likely to be melted to cause difficult film formation. If the AC voltage is greater than 3 kV, impact during a discharge is large, so that the irregularities of the surface of the substrate are large, and a flat and homogeneous film is not formed while the original surface shape is maintained. The carbon material coating can be formed even if film-forming apparatus 10 of FIG. 1 is operated at the same AC voltage as that in the conventional coating method, but the coating becomes a soft coating having many SP2 bonds. When the AC voltage is slightly greater than 3 kV, a coating is provided, in which an SP2 bond, an SP2-like bond, an SP3 bond, and an SP3-like bond are inhomogeneously mixed, so that the AC voltage is greater than or equal to 3.6 kV in the present example. The AC voltage in the present example is preferably greater than or equal to 7 kV, more preferably greater than or equal to 8 kV, and most preferably greater than or equal to 9 kV.

In order to momentarily impart a high energy to discharge electrode 1, it is effective to increase the frequency of the AC voltage. For example, the frequency may be greater than or equal to a commercial frequency (50 Hz or 60 Hz) and less than or equal to 13.56 MHz. The range of the frequency is preferably, for example, greater than or equal to 50 Hz and less than or equal to 100 MHz, and more preferably greater than or equal to 10 kHz and less than or equal to 15 MHz.

When a bias potential at which support electrode 3 (substrate 20) has a negative potential is applied by bias power source 5, the absolute value of the bias potential is preferably greater than or equal to 100 V. This is higher by 20% or more than a bias potential in a conventional high melting point metal coating method. The bias potential in the conventional coating method is greater than or equal to about 30 V and less than or equal to 80 V. The upper limit of the bias potential in the present example is preferably 500 V. The increase in the bias potential provides a high probability of converting the SP3 bond to the SP3-like bond.

In order to increase the ratios of the SP3 bond and the SP3-like bond in hard carbon-based coating 22, it is effective to independently control the above-described AC voltage (AC current) and bias voltage (bias current). For example, when the AC voltage and the bias voltage are respectively greater than 4.2 kV and greater than 112 V, hard carbon-based coating 22 having a homogeneous SP3-like bond is provided. In order to increase the ratios, it is also effective to change the distance between substrate 20 and discharge electrode 1. This is because a large energy can be momentarily imparted to discharge electrode 1. In order to change the distance, for example, discharge electrode 1 may be vibrated with a vibration device or the like.

For discharge electrode 1, a conductive carbon material such as graphite is used. Discharge electrode 1 may contain a binder other than carbon that binds the carbon material. The content of the carbon in discharge electrode 1 is preferably greater than or equal to 90% by mass, more preferably greater than or equal to 95% by mass, and most preferably greater than or equal to 99% by mass. Furthermore, among the elements other than carbon, the content of a covalent bond element is preferably greater than or equal to 50% by mass. Furthermore, the carbon material of the discharge electrode preferably has the characteristics of the hard carbon-based coating of the present disclosure.

Support electrode 3 is not particularly limited. For example, as shown in FIG. 1, support electrode 3 may be a flat electrode having a plane area larger than the area of substrate 20 planarly viewed from the side of surface 21. Support electrode 3 may be composed of Cu (copper) or the like having excellent conductivity.

In addition, the temperature of substrate 20 during film formation is preferably less than or equal to 600° C. The temperature of substrate 20 may also be around normal temperature. For example, a film formation atmosphere around substrate 20 during film formation may be a room temperature-air atmosphere. In that case, hard carbon-based coating 22 can be formed with simpler equipment. In the air atmosphere, a part of nitrogen contained in the air may be contained in hard carbon-based coating 22. The film formation atmosphere may be an atmosphere containing greater than or equal to 95% by volume of nitrogen. This can provide hard carbon-based coating 22 containing more nitrogen. In order to mix atomic nitrogen instead of molecular nitrogen in hard carbon-based coating 22, hard carbon-based coating 22 is preferably formed in a film formation atmosphere containing a gas (such as $NH_3$) that easily separates the atomic nitrogen. Hard carbon-based coating 22 containing nitrogen provides a widened applicable range for a work material that reacts with carbon alone, which is preferable. If hard carbon-based coating 22 contains nitrogen in an atomic ratio of greater than or equal to 5%, an effect of suppressing the reaction to the work material is actualized. If hard carbon-based coating 22 contains nitrogen in an atomic ratio of greater than or equal to 10%, the effect is remarkable. If hard carbon-based coating 22 contains nitrogen in an atomic ratio of greater than or equal to 30%, the effect is more remarkable.

Discharge electrode 1 is consumed as hard carbon-based coating 22 is formed. Therefore, it is preferable to monitor the distance between discharge electrode 1 and substrate 20 to adjust the distance to be constant. For example, using a device that automatically adjusts the distance, the distance may be maintained at 0.5 mm. In addition, discharge electrode 1 may be mechanically vibrated with a vibration device or the like, to rub discharge electrode 1 against surface 21 of substrate 20. In that case, the distance between discharge electrode 1 and substrate 20 is periodically increased by vibration, and when the distance is increased, a discharge can be generated. The distance varies between about 0 mm and 1 mm.

(2) Manufacturing Method Utilizing DC

Figure 2:
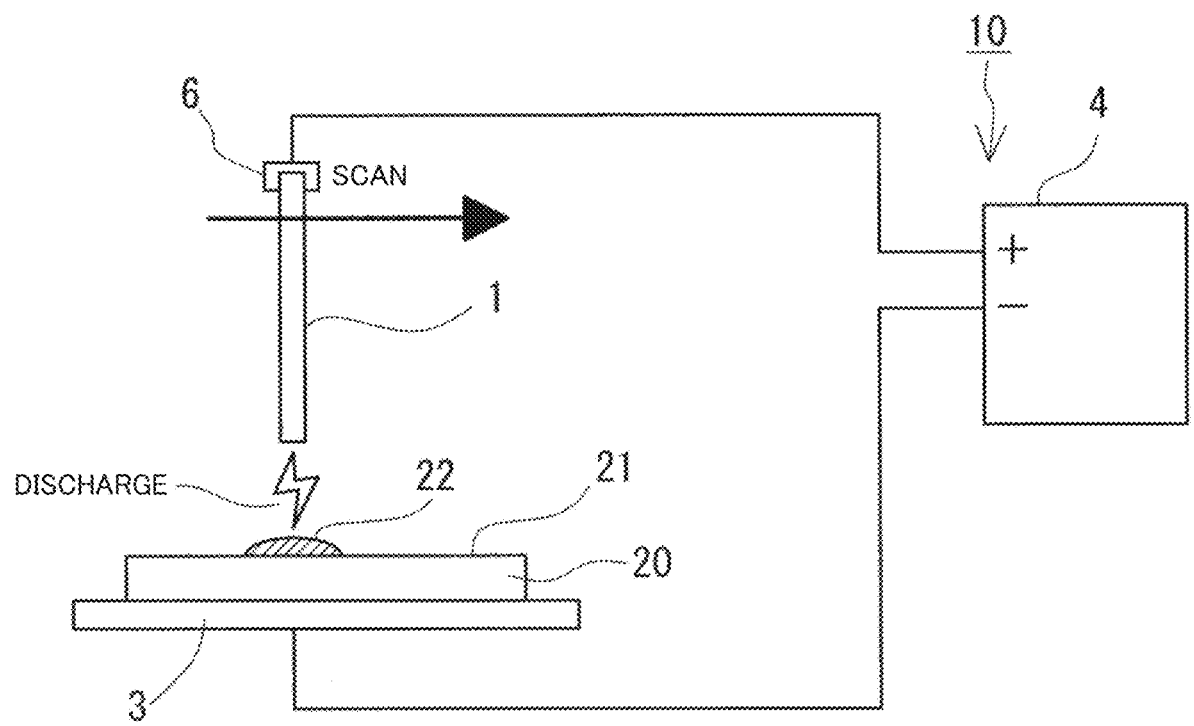
FIG. 2 is an illustration showing a method for manufacturing a hard carbon-based coating using a second film-forming apparatus.

FIG. 2 is a diagram for illustrating a method for manufacturing a hard carbon-based coating using DC. A film-forming apparatus 10 shown in FIG. 2 includes a power supply device 4 that generates DC and a vibration device 6 that vibrates a discharge electrode 1 in addition to discharge electrode 1 and support electrode 3 shown in FIG. 1. In the present example, a substrate 20 is installed on support electrode 3. Discharge electrode 1 is brought close to substrate 20, to cause power supply device 4 to apply a DC voltage to discharge electrode 1, and to cause vibration device 6 to vibrate discharge electrode 1. Also in the present example, a hard carbon-based coating 22 can be formed over a wide range by causing discharge electrode 1 to scan a surface 21 of substrate 20 in parallel.

The DC voltage of power supply device 4 is preferably greater than or equal to 3.6 kV. When the DC voltage is slightly greater than 3 kV, a coating is provided, in which an SP2 bond, an SP2-like bond, an SP3 bond, and an SP3-like bond are inhomogeneously mixed, so that the DC voltage is greater than or equal to 3.6 kV in the present example. The DC voltage in the present example is preferably greater than or equal to 7 kV, more preferably greater than or equal to 8 kV, and most preferably greater than or equal to 9 kV.

Vibration device 6 grips one end of discharge electrode 1 (the side opposite to substrate 20), to periodically vibrate discharge electrode 1. When the vibration causes the distance between discharge electrode 1 and substrate 20 to be changed to a distance of less than or equal to a predetermined value, a discharge occurs. Vibration device 6 is adjusted such that the pulse width of the discharge is less than 100 milliseconds. For example, the frequency of discharge electrode 1 provided by vibration device 6 may be greater than or equal to 1 Hz, and preferably greater than or equal to 10 Hz or greater than or equal to 50 Hz. By momentarily applying a large energy to discharge electrode 1, the ratios of the SP3 bond and the SP3-like bond in hard carbon-based coating 22 can be increased.

Also in the present example, a bias potential at which support electrode 3 has a negative potential may be imparted. A bias power source 5 shown in FIG. 1 can be used for imparting the bias potential. The bias potential may be a self-bias potential. In FIG. 2, the illustration of the bias power source is omitted.

(3) Manufacturing Method Utilizing Pulse Voltage

Figure 3:
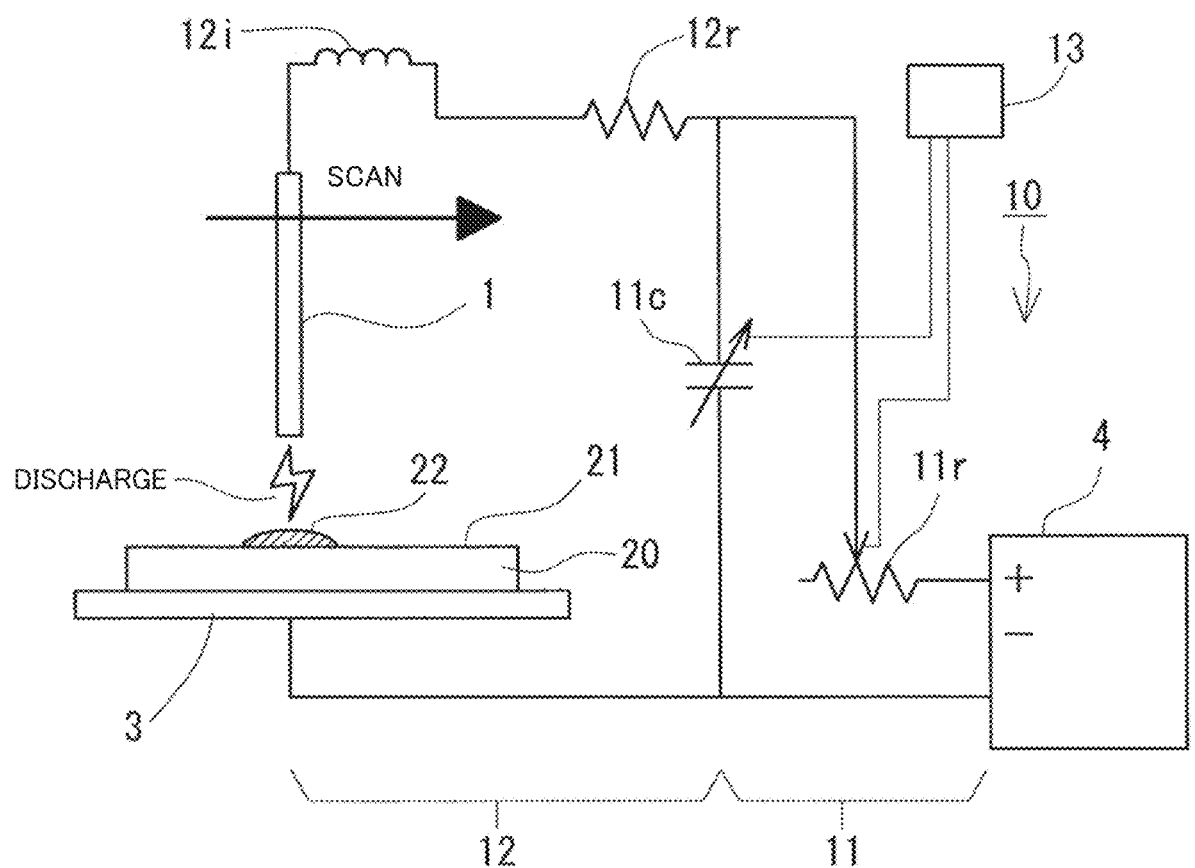
FIG. 3 is an illustration showing a method for manufacturing a hard carbon-based coating using a third film-forming apparatus.

As described above, in order to increase the ratios of the SP3 bond and the SP3-like bond in hard carbon-based coating 22, it is preferable to momentarily apply a large amount of energy to a discharge electrode 1. From the viewpoint, a pulse voltage may be applied to discharge electrode 1. FIG. 3 is a diagram for illustrating a method for manufacturing a hard carbon-based coating utilizing a pulse voltage. A film-forming apparatus 10 shown in FIG. 3 includes a charge circuit 11, a discharge circuit 12, and a discharge control unit 13 in addition to discharge electrode 1, support electrode 3, and power supply device 4 shown in FIG. 2. The charge circuit 11 includes a variable resistor 11r connected to a positive electrode of power supply device 4, and a variable capacitor 11c provided on a connecting line connecting a positive electrode line and a negative electrode line downstream of variable resistor 11r. Discharge circuit 12 includes variable capacitor 11c of charge circuit 11, and a resistor 12r and an inductor 12i connected in series to variable resistor 11r downstream of the connecting line. Discharge control unit 13 changes the values of variable resistor 11r and variable capacitor 11c. According to film-forming apparatus 10 of the present example, electric power stored in variable capacitor 11c of charge circuit 11 can be applied to discharge electrode 1 in a pulse form by discharge circuit 12. By applying a pulsed voltage to discharge electrode 1, a pulsed discharge occurs between discharge electrode 1 and a substrate 20, to form a hard carbon-based coating 22 on a surface 21 of the substrate 20. Also in the present example, a hard carbon-based coating 22 can be formed over a wide range by causing discharge electrode 1 to scan a surface 21 of substrate 20 in parallel.

The pulsed discharge preferably satisfies any of the following conditions:

a voltage between discharge electrode 1 and substrate 20 is greater than 125 V, and a pulse width is less than 1 millisecond; and the voltage between discharge electrode 1 and substrate 20 is greater than 50 V, and the pulse width is less than 10 microseconds.

Hard carbon-based coating 22 can be formed on substrate 20 by causing discharge control unit 13 to control charge circuit 11 and discharge circuit 12 so as to satisfy the above conditions. Discharge control unit 13 changes the values of variable resistor 11r and variable capacitor 11c, whereby a voltage between discharge electrode 1 and substrate 20 can be adjusted. The pulse width can be adjusted by changing at least one of resistor 12r and inductance 12i. The voltage and pulse width between discharge electrode 1 and substrate 20 can be measured by observation using an oscilloscope utilizing a high voltage probe or the like.

In order to adjust the pulse width, discharge electrode 1 may be vibrated. For the vibration of discharge electrode 1, vibration device 6 shown in FIG. 2 can be utilized.

By increasing the discharge voltage, the number of SP3 bond and SP3-like bond sites (D band sites) in hard carbon-based coating 22 can be increased. For example, when D/G>10.5, which will be described later, is achieved, the discharge voltage may be greater than or equal to 400 V. Meanwhile, by reducing the discharge voltage, the number of the SPx bond and the SPx-like bond sites in hard carbon-based coating 22 can be increased. For example, the discharge voltage may be greater than or equal to 80 V and less than 110 V. The discharge voltage is more preferably greater than or equal to 100 V and less than 110 V.

<<Member Provided with Coating>>

Figure 4:
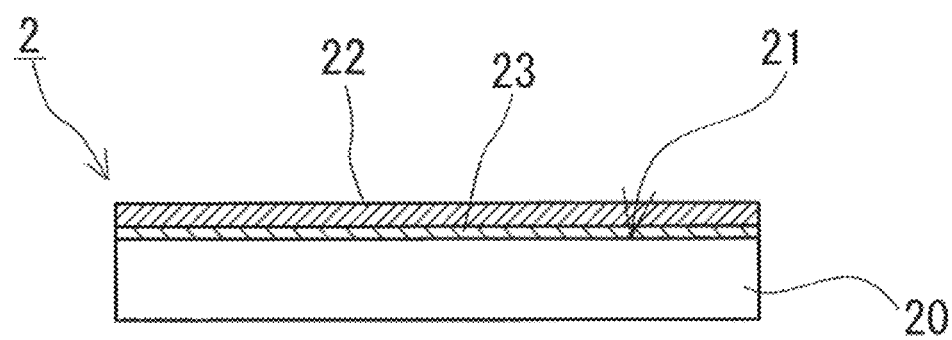
FIG. 4 is a schematic cross-sectional view of a member provided with coating in which a hard carbon-based coating is formed on a substrate.

According to the method for manufacturing a hard carbon-based coating described above, a member provided with coating 2 as shown in FIG. 4 can be provided. The member provided with coating 2 includes a substrate 20 and a hard carbon-based coating 22 formed on at least a part of substrate 20 (here, a surface 21).

Examples of substrate 20 include cemented carbide, an iron-based material, a boron carbon nitride-based material, a cubic boron nitride-based material, cermet, a Ni-based material, and conductive ceramic. These materials are main constituent materials for tools.

Hard carbon-based coating 22 formed by the above-described method for manufacturing a hard carbon-based coating can be identified by a Raman spectrometric method. The identifying method is broadly divided into three methods.
(1) First Identifying Method A peak position X in the Raman spectrometric method of hard carbon-based coating 22, and a half-value width W at the peak position satisfy the following [Condition I].

$$38 \text{ cm}^{-1} < W < 500 \text{ cm}^{-1}$$

$$16 \times (X - 1347.5) + 39 < W < 16 \times (X - 1335) + 39$$

$$X < 1370 \text{ cm}^{-1} \quad \text{[Condition I]}$$

As described above, in the spectrum obtained by the Raman spectrometric method, the SP3 bond forms a peak at a position of greater than or equal to 1325 cm$^{-1}$ and less than 1335 cm$^{-1}$, and the SP3-like bond forms a peak at a position of greater than or equal to 1335 cm$^{-1}$ and less than 1400 cm$^{-1}$. In the spectrum obtained by the Raman spectrometric method, the SP2 bond forms a peak having a half-value width of less than 20 cm$^{-1}$ at a position of greater than or equal to 1500 cm$^{-1}$ and less than 1650 cm$^{-1}$, and the SP2-like bond forms a peak having a half-value width of greater than or equal to 20 cm$^{-1}$ at a position of greater than or equal to 1500 cm$^{-1}$ and less than 1650 cm$^{-1}$. Therefore, if the results of measuring the hard carbon-based coating according to the Raman spectrometric method using a laser having an excitation wavelength of 532 nm satisfy the above range, the SP3 bond and the SP3-like bond can be determined to be formed in the hard carbon-based coating.

Hard carbon-based coating 22 has a high hardness, and is less likely to chip. When the peak position and the half-value width decrease, the hardness tends to increase, and when the peak position and the half-value width increase, the chipping resistance tends to improve.
(2) Second Identifying Method A ratio D/G of the peak intensity of a D band to the peak intensity of a G band in the Raman spectrometric method of the hard carbon-based coating, and a half-value width W in the D band satisfy the following [Condition II-A] or [Condition II-B] or [Condition II-C], $$W \leq 115 \text{ cm}^{-1}$$

$$D/G < 9.0$$

$$80/(D/G)^{0.5} < W < 180/(D/G)^{0.5} \quad \text{[Condition II-A]}$$

$$115 \text{ cm}^{-1} < W < 500 \text{ cm}^{-1}$$

$$D/G < 2.8 \quad \text{[Condition II-B]}$$

$$W < 50 \text{ cm}^{-1} (W < 30 \text{ cm}^{-1}, \text{more preferably} < 20 \text{ cm}^{-1})$$

$$D/G > 10.5 (\text{more preferably } D/G > 50, \text{still more preferably } D/G > 300) \quad \text{[Condition II-C]}$$

As described above, in the present specification, the peak formed at greater than or equal to 1325 cm$^{-1}$ and less than 1400 cm$^{-1}$ is the D band, and the peak formed at greater than or equal to 1500 cm$^{-1}$ and less than 1650 cm$^{-1}$ is the G band. That is, the D band corresponds to the SP3 bond and the SP3-like bond, and the G band corresponds to the SP2 bond and the SP2-like bond. Therefore, if the peak intensity ratio D/G of both the bands, and the half-value width W in the D band satisfy the above range, the SP3 bond and the SP3-like bond can be determined to be formed in the hard carbon-based coating.

Hard carbon-based coating 22 has a high hardness, and is less likely to chip and wear. When D/G increases, the wear resistance tends to increase, and when the half-value width increases, the chipping resistance tends to improve.
(3) Third Identifying Method In hard carbon-based coating 22 obtained by the method for manufacturing a hard carbon-based coating according to an embodiment, sites having different carbon atom bonding states may be formed in a marble or granular form. In that case, hard carbon-based coating 22 includes at least one of a site that satisfies the following [Condition III-A], a site that satisfies the following [Condition III-B], and a site that satisfies the following [Condition III-C].
[Condition III-A]

A peak position in the Raman spectrometric method is greater than or equal to 1335 cm$^{-1}$ and less than or equal to 1349 cm$^{-1}$, and a half-value width at the peak position is greater than or equal to 30 cm$^{-1}$ and less than or equal to 95 cm$^{-1}$. The half-value width is preferably greater than or equal to 30 cm$^{-1}$ and less than or equal to 90 cm$^{-1}$, more preferably greater than or equal to 40 cm$^{-1}$ and less than or equal to 73 cm$^{-1}$, and most preferably greater than or equal to 62 cm$^{-1}$ and less than or equal to 73 cm$^{-1}$.
[Condition III-B]

A peak position in the Raman spectrometric method is greater than or equal to 1349 cm$^{-1}$ and less than or equal to 1370 cm$^{-1}$, and a half-value width at the peak position is greater than or equal to 95 cm$^{-1}$ and less than or equal to 350 cm$^{-1}$. Furthermore, the peak position is preferably greater than or equal to 1350 cm$^{-1}$ and less than or equal to 1365 cm$^{-1}$. The half-value width is more preferably greater than or equal to 120 cm$^{-1}$ and less than or equal to 350 cm$^{-1}$, and most preferably greater than or equal to 130 cm$^{-1}$ and less than or equal to 300 cm$^{-1}$.
[Condition III-C]

A peak position in the Raman spectrometric method is greater than or equal to 1300 cm$^{-1}$ and less than or equal to 1335 cm$^{-1}$, and a half-value width at the peak position is greater than or equal to 1 cm$^{-1}$ and less than or equal to 29 cm$^{-1}$.

If the site measured by the Raman spectrometric method satisfies any of the above [Condition III-A], [Condition III-B], and [Condition III-C], the bonding state of the carbon atom of the site is observed to be the SP3 bond or the SP3-like bond. Among these, the inclusion of at least [Condition III-A] is more preferable than a combination not including [Condition III-A]. This is because the site of [Condition III-A] has intermediate characteristics between the site of [Condition III-B] and the site of [Condition III-C] to provide improved overall affinity.

Hard carbon-based coating film 22 may include a site that satisfies [Condition IV-A] to [Condition IV-I] described in the next item.
(4) Fourth Identifying Method In hard carbon-based coating 22 obtained by the method for manufacturing a hard carbon-based coating according to an embodiment, sites having different carbon atom bonding states may be formed in a marble or granular form. In that case, hard carbon-based coating 22 includes a D band site formed at greater than or equal to 1325 cm$^{-1}$ and less than or equal to 1400 cm$^{-1}$, and a G band site formed at greater than or equal to 1500 cm$^{-1}$ and less than or equal to 1650 cm$^{-1}$, and further includes a site (N band area) that satisfies at least one of the following [Condition IV-A] to [Condition IV-I].
[Condition IV-A]

A peak position in the Raman spectrometric method is within a range of 910±50 cm$^{-1}$. The peak position is preferably within a range of 910±30 cm$^{-1}$, and more preferably within a range of 910±10 cm$^{-1}$. The half-value width of the peak is less than 200 cm$^{-1}$. The half-value width of the peak is preferably less than 100 cm$^{-1}$, and more preferably less than 70 cm$^{-1}$.

[Condition IV-B]

A peak position in the Raman spectrometric method is within a range of 810±cm$^{-1}$. The peak position is preferably within a range of 810±20 cm$^{-1}$, and more preferably within a range of 815±10 cm$^{-1}$. The half-value width of the peak is less than 200 cm$^{-1}$. The half-value width of the peak is preferably less than 100 cm$^{-1}$, and more preferably less than 70 cm$^{-1}$.

[Condition IV-C]

A peak position in the Raman spectrometric method is within a range of 705±cm$^{-1}$. The peak position is preferably within a range of 705±20 cm$^{-1}$, and more preferably within a range of 705±10 cm$^{-1}$. The half-value width of the peak is less than 200 cm$^{-1}$. The half-value width of the peak is preferably less than 100 cm$^{-1}$, and more preferably less than 70 cm$^{-1}$.

[Condition IV-D]

A peak position in the Raman spectrometric method is within a range of 535±30 cm$^{-1}$. The peak position is preferably within a range of 535±20 cm$^{-1}$, more preferably within a range of 535±15 cm$^{-1}$, and still more preferably within a range of 505±10 cm$^{-1}$. The half-value width at the peak position is less than 800 cm$^{-1}$. The half-value width of the peak is preferably less than 300 cm$^{-1}$, and more preferably less than 100 cm$^{-1}$.

[Condition IV-E]

A peak position in the Raman spectrometric method is within a range of 260±20 cm$^{-1}$. The peak position is preferably within a range of 260±15 cm$^{-1}$, and more preferably within a range of 260±10 cm$^{-1}$. The half-value width of the peak is less than 100 cm$^{-1}$. The half-value width of the peak is preferably less than 80 cm$^{-1}$, and more preferably less than 50 cm$^{-1}$.

[Condition IV-F]

A peak position in the Raman spectrometric method is within a range of 210±cm$^{-1}$. The peak position is preferably within a range of 210±15 cm$^{-1}$, and more preferably within a range of 210±10 cm$^{-1}$. The half-value width of the peak is less than 100 cm$^{-1}$. The half-value width of the peak is preferably less than 80 cm$^{-1}$, and more preferably less than 50 cm$^{-1}$.

[Condition IV-G]

A peak position in the Raman spectrometric method is within a range of 135±cm$^{-1}$. The peak position is preferably within a range of 135±15 cm$^{-1}$, and more preferably within a range of 135±10 cm$^{-1}$. The half-value width of the peak is less than 80 cm$^{-1}$. The half-value width of the peak is preferably less than 40 cm$^{-1}$, and more preferably less than 20 cm$^{-1}$.

[Condition IV-H]

A peak position in the Raman spectrometric method is within a range of 95±10 cm$^{-1}$. The peak position is preferably within a range of 95±8 cm$^{-1}$, and more preferably within a range of 95±5 cm$^{-1}$. The half-value width of the peak is less than cm$^{-1}$. The half-value width of the peak is preferably less than 10 cm$^{-1}$, and more preferably less than 5 cm$^{-1}$.

[Condition IV-I]

A peak position in the Raman spectrometric method is within a range of 2327±cm$^{-1}$. The peak position is preferably within a range of 2327±7 cm$^{-1}$, and more preferably within a range of 2327±5 cm$^{-1}$. The half-value width of the peak is less than 16 cm$^{-1}$. The half-value width of the peak is preferably less than 8 cm$^{-1}$, and more preferably less than 5 cm$^{-1}$.

The N band area is observed in a fibrous carbon material and a lubricious conductive carbon material. The fibrous carbon material is considered to have an effect of increasing the bending strength of a tool on which hard carbon-based coating 22 is formed. Meanwhile, the lubricious conductive carbon material is considered to have an effect of reducing the cutting resistance of a tool on which hard carbon-based coating 22 is formed. Therefore, a tool provided with hard carbon-based coating 22 including the N band area is expected to be a tool having excellent bending strength, chipping resistance, and wear resistance.

The lubricious conductive carbon material is considered to have an effect of improving the durability and capacity of the electrode material on which hard carbon-based coating 22 is formed. Therefore, the electrode material provided with hard carbon-based coating 22 including N band area is expected to have excellent durability and can be used for a high-capacity battery.

Here, in the N band area, the peak of the D band is also detected. N/D can be used to identify the N band area in a Raman image. N/D is a ratio of the peak intensity of the N band to the peak intensity of the D band. N/D is preferably greater than or equal to ⅕ and less than or equal to 15. N/D is more preferably greater than or equal to ⅓ and less than or equal to 6.

Hard carbon-based coating 22 may contain atoms other than carbon. For example, hard carbon-based coating 22 may contain greater than or equal to 5 atom % and less than or equal to 60 atom % of nitrogen, or greater than or equal to 5 atom % and less than or equal to 50 atom % of boron. In the former form, carbon nitride is contained in hard carbon-based coating 22, and in the latter form, boron carbon nitride is contained in hard carbon-based coating 22. In addition, hard carbon-based coating 22 may contain aluminum, silicon, and phosphorus in a total amount of greater than or equal to 5 atom % and less than or equal to 50 atom %.

(Other Configurations)

The surface roughness Ra of hard carbon-based coating 22 is preferably greater than or equal to 0.1 μm. If the surface roughness Ra of hard carbon-based coating 22 is greater than or equal to 0.1 μm, the adhesiveness becomes strong. Here, Ra in the present specification is an arithmetic average roughness defined in JIS B0601 (2001).

The thickness of hard carbon-based coating 22 can be appropriately selected. For example, the thickness of hard carbon-based coating 22 may be less than or equal to 10 μm. The thickness is not necessarily uniform, and the thickness of the thickest portion may be less than or equal to 10 μm. By setting the thickness to less than or equal to 10 μm, the peeling-off of hard carbon-based coating 22 is easily suppressed. The thickness can be adjusted by changing the scanning speed of discharge electrode 1 in FIGS. 1 to 3. The thickness of hard carbon-based coating 22 can also be increased by causing discharge electrode 1 to scan hard carbon-based coating 22.

The average particle size of hard carbon-based coating 22 is preferably less than or equal to 10 μm. If the average particle size of hard carbon-based coating 22 is less than or equal to 10 μm, the toughness of hard carbon-based coating 22 can be improved. The average particle size of hard carbon-based coating 22 can be obtained by microscope observation of hard carbon-based coating 22. Specifically, the areas of or more crystal particles are measured, to determine the diameter of a circle equivalent to the area of each particle. The average value of the obtained diameters is the average particle size of hard carbon-based coating 22.

The surface roughness Ra of surface 21 of substrate 20 on which hard carbon-based coating 22 is to be formed is also preferably greater than or equal to 0.1 µm. If the surface roughness Ra of substrate 20 is greater than or equal to 0.1 µm, the junction area between substrate 20 and hard carbon-based coating 22 becomes large, whereby hard carbon-based coating 22 is less likely to peel off.

Between surface 21 of substrate 20 and hard carbon-based coating 22, an intermediate layer 23 that improves the adhesiveness between them may be provided. Examples of intermediate layer 23 include a metal layer or a composite metal layer containing at least one of Ni, Ti, Zr, Hf, Nb, Ta, Mo, and W. Examples of intermediate layer 23 include a ceramic layer or laminated ceramic containing at least one of TiN, ZrN, HfN, NbN, TaN, NbC, TaC, MoC, and WC. The average thickness of intermediate layer 23 is preferably less than or equal to 10 µm.

Test Examples

Using a film-forming apparatus 10 of any of FIGS. 1 to 3, a member provided with coating 2 including a hard carbon-based coating 22 shown in FIG. 4 was produced.

<<Test 1>>

In Test 1, a hard carbon-based coating 22 was formed by a film-forming apparatus 10 (without a bias power source 5) using AC shown in FIG. 1. First, a substrate 20 having a size of 30 mm×30 mm×1 mmt and composed of Mo or tungsten carbide (WC) was placed on a support electrode 3 composed of Cu and having a size of 100 mm×100 mm×5 mmt. Then, while an AC voltage of 8 kV and 60 Hz was applied between support electrode 3 and a discharge electrode 1 composed of a carbon rod, discharge electrode 1 was brought close to substrate 20 so as not to come into contact therewith. An AC current of about 1 A flowed between discharge electrode 1 and substrate 20 during a discharge. Since discharge electrode 1 was vibrated at 60 Hz, the discharge occurred when a separation distance between discharge electrode 1 and substrate 20 became short during vibration. A self-bias voltage generated between support electrode 3 and discharge electrode 1 is −200 V.

Hard carbon-based coating 22 was formed on substrate 20, and was evaluated by a Raman spectrometric method using a laser having an excitation wavelength of 532 nm. In the evaluation, a region of 100 µm square including the two-dimensional center of gravity of the coated region of hard carbon-based coating 22 is analyzed with the mapping function or imaging function of a Raman spectrometer, to produce a Raman image color-coded according to characteristics or shading-displayed. In the Raman image, a main portion having a D band area ratio of greater than 50% was identified, and the Raman peak and half-value width of the main portion were investigated. The results are shown in Table 1. A Raman peak (1) in Table 1 is a peak detected in the main portion, and is the largest peak among the D bands indicating the presence of an SP3 bond and an SP3-like bond. A Raman peak (2) is a peak detected in the main portion, and is the largest peak among the G bands indicating the presence of an SP2 bond and an SP2-like bond. D/G is a peak ratio obtained by dividing the peak intensity of the D band by the peak intensity of the G band. The meanings of terms in Table are the same in Tables 2 to 9 to be described later.

TABLE 1

| Sample | AC voltage (kV) | AC frequency (Hz) | Bias voltage (V) | Substrate material | Vibration frequency of electrode (Hz) | Raman spectrophotometry | | | | Peak ratio (D/G) |
|---|---|---|---|---|---|---|---|---|---|---|
| | | | | | | Raman peak (1) (Unit: cm$^{-1}$) | | Raman peak (2) (Unit: cm$^{-1}$) | | |
| | | | | | | Peak position | Half-value width | Peak position | Half-value width | |
| 1-1 | 8 | 60 | −200 | Mo | 60 | 1348 | 56 | 1583 | 47 | 3.0 |
| 1-2 | 8 | 60 | −200 | WC | 60 | 1347 | 59 | 1587 | 53 | 3.4 |

As shown in Table 1, in Sample 1-1, a spectrum of an SP3-like bond having a half-value width of 56 cm$^{-1}$ at a peak position of 1348 cm$^{-1}$ and a spectrum of an SP2-like bond having a half-value width of 47 cm$^{-1}$ at a peak position of 1583 cm$^{-1}$ were confirmed. In Sample 1-2, a spectrum of an SP3-like bond having a half-value width of 59 cm$^{-1}$ at a peak position of 1347 cm$^{-1}$ and a spectrum of an SP2-like bond having a half-value width of 53 cm$^{-1}$ at a peak position of 1587 cm$^{-1}$ were confirmed. The coatings of Samples 1-1 and 1-2 were found to be hard carbon-based coating 22 that simultaneously satisfies [Condition I], [Condition II-A], and [Condition III-A] described in the item of a member provided with coating 2.

The ratio (area ratio) of an area showing a Raman spectral distribution of Table 1 in the planar area of hard carbon-based coating 22 of each sample was examined. The area ratio was calculated by utilizing a color-coded Raman image or a shading-displayed Raman image. As a result, the area ratio of Sample 1-1 was 92%, and the area ratio of Sample 1-2 was 98%.

<<Test 2>>

In Test 2, using the same film-forming apparatus 10 as that in Test 1, a hard carbon-based coating 22 was formed on a SUS310 substrate 20 having a size of 30 mm×20 mm×1 mmt. At that time, while an AC voltage of 7 kV and 60 Hz was applied between a support electrode 3 and a discharge electrode 1, discharge electrode 1 was rubbed against a surface 21 of substrate 20 to cause discharge electrode 1 to scan surface 21. An AC current of about 0.8 A flowed between discharge electrode 1 and substrate 20 during a discharge. Since vibration of 60 Hz was applied to discharge electrode 1, a discharge occurred when discharge electrode 1 was separated from surface 21 of substrate 20 by a certain amount or more due to the vibration. At that time, a self-bias voltage of −200 V was generated between support electrode 3 and discharge electrode 1. Hard carbon-based coating 22 was formed on substrate 20, and was evaluated by a Raman spectrometric method. The results are shown in Table 2.

TABLE 2

| Sample | AC voltage (kV) | AC frequency (Hz) | Bias voltage (V) | Substrate material | Vibration frequency of electrode (Hz) | Raman spectrophotometry | | | | Peak ratio (D/G) |
|---|---|---|---|---|---|---|---|---|---|---|
| | | | | | | Raman peak (1) (Unit: cm$^{-1}$) | | Raman peak (2) (Unit: cm$^{-1}$) | | |
| | | | | | | Peak position | Half-value width | Peak position | Half-value width | |
| 2-1 | 7 | 60 | −200 | SUS310 | 60 | 1350 | 54 | 1604 | 65 | 2.8 |

In Sample 2-1, a spectrum of an SP3-like bond having a half-value width of 54 cm$^{-1}$ at a peak position of 1350 cm$^{-1}$ and a spectrum of an SP2-like bond having a half-value width of 65 cm$^{-1}$ at a peak position of 1604 cm$^{-1}$ were confirmed. The coating of Sample 2-1 was found to be hard carbon-based coating 22 satisfying [Condition II-A].

In Test 2, an area ratio in the sample was examined in the same manner as in Test 1. As a result, the area ratio of Sample 2-1 was 82%.

<<Test 3>>

In Test 3, using the same film-forming apparatus 10 as that in Test 1, a hard carbon-based coating 22 was formed on a cemented carbide substrate 20 of 10 mm×10 mm×5 mmt. Substrate 20 is an insert tip containing 10% by mass of Co and the balance being composed of WC and inevitable impurities. In forming hard carbon-based coating 22, while an AC voltage of 8 kV and 60 Hz was applied between a support electrode 3 and a discharge electrode 1, discharge electrode 1 was rubbed against a surface 21 of substrate 20 to cause discharge electrode 1 to scan surface 21. An AC current of about 0.8 A flowed between discharge electrode 1 and substrate 20 during a discharge. Since vibration of 60 Hz was applied to discharge electrode 1, a discharge occurred when discharge electrode 1 was separated from surface 21 of substrate 20 by a certain amount or more due to the vibration. At that time, a self-bias voltage of −200 V was generated between support electrode 3 and discharge electrode 1. Hard carbon-based coating 22 was formed on substrate 20, and was evaluated by a Raman spectrometric method. The results are shown in Table 3. Here, in the analysis, the surface of the cemented carbide was treated with acid, to cause the acid to remove Co in the binder.

In Sample 3-1, a spectrum of an SP3-like bond having a half-value width of 55 cm$^{-1}$ at a peak position of 1348 cm$^{-1}$ and a spectrum of an SP2-like bond having a half-value width of 40 cm$^{-1}$ at a peak position of 1580 cm$^{-1}$ were confirmed. It was found that hard carbon-based coating 22 simultaneously satisfies [Condition I], [Condition II-A], and [Condition III-A].

Also in Test 3, an area ratio in the Sample was examined in the same manner as in Test 1. As a result, the area ratio of Sample 3-1 was 95%.

<<Test 4>>

In Test 4, an intermediate layer 23 was formed on a surface 21 of an insert tip (substrate 20) in Test 3, and a hard carbon-based coating 22 was formed on substrate 20 using the same film-forming apparatus 10 as that in Test 1. Intermediate layer 23 was a Ni plating layer having a thickness of less than or equal to 10 μm, or a TiN plating layer having a thickness of less than or equal to 10 μm. While an AC voltage of 7.5 kV and 60 Hz was applied between a support electrode 3 and a discharge electrode 1 in order to form hard carbon-based coating 22, discharge electrode 1 was rubbed against a surface 21 of substrate 20 to cause discharge electrode 1 to scan surface 21. Since vibration of 60 Hz was applied to discharge electrode 1, a discharge occurred when discharge electrode 1 was separated from surface 21 of substrate 20 by a certain amount or more due to the vibration. At that time, a self-bias voltage of −180 V was generated between support electrode 3 and discharge electrode 1. Hard carbon-based coating 22 was formed on substrate 20, and was evaluated by a Raman spectrometric method. The results are shown in Table 4.

TABLE 3

| Sample | AC voltage (kV) | AC frequency (Hz) | Bias voltage (V) | Substrate material (% by mass) | Vibration frequency of electrode (Hz) | Raman spectrophotometry | | | | Peak ratio (D/G) |
|---|---|---|---|---|---|---|---|---|---|---|
| | | | | | | Raman peak (1) (Unit: cm$^{-1}$) | | Raman peak (2) (Unit: cm$^{-1}$) | | |
| | | | | | | Peak position | Half-value width | Peak position | Half-value width | |
| 3-1 | 8 | 60 | −200 | WC:Co (10%) | 60 | 1348 | 55 | 1580 | 40 | 2.8 |

TABLE 4

| Sample | AC voltage (kV) | AC frequency (Hz) | Bias voltage (V) | Substrate material (% by mass) | Vibration frequency of electrode (Hz) | Raman peak (1) (Unit: cm$^{-1}$) Peak position | Raman peak (1) (Unit: cm$^{-1}$) Half-value width | Raman peak (2) (Unit: cm$^{-1}$) Peak position | Raman peak (2) (Unit: cm$^{-1}$) Half-value width | Peak ratio (D/G) |
|---|---|---|---|---|---|---|---|---|---|---|
| 4-1 | 7.5 | 60 | −180 | Ni/WC:Co (10%) | 60 | 1346 | 50 | 1583 | 50 | 2.7 |
| 4-2 | 7.5 | 60 | −180 | TiN/WC:Co (10%) | 80 | 1349 | 50 | 1580 | 50 | 2.6 |

In Sample 4-1, a spectrum of an SP3-like bond having a half-value width of 50 cm$^{-1}$ at a peak position of 1346 cm$^{-1}$ and a spectrum of an SP2-like bond having a half-value width of 50 cm$^{-1}$ at a peak position of 1583 cm$^{-1}$ were confirmed. In Sample 1-2, a spectrum of an SP3-like bond having a half-value width of 50 cm$^{-1}$ at a peak position of 1349 cm$^{-1}$ and a spectrum of an SP2-like bond having a half-value width of 50 cm$^{-1}$ at a peak position of 1580 cm$^{-1}$ were confirmed. It was found that, the coating of Sample 4-1 is the hard carbon-based coating 22 that simultaneously satisfies [Condition I], [Condition II-A], and [Condition III-A], and the coating of Sample 4-2 is the hard carbon-based coating 22 that simultaneously satisfies [Condition II-A] and [Condition III-A].

Also in Test 4, an area ratio in the Sample was examined in the same manner as in Test 1. As a result, the area ratio of sample 4-1 was 88%, and the area ratio of Sample 4-2 was 85%.

<<Test 5>>

In Test 5, Samples 5-1 to 5-11 in which a hard carbon-based coating 22 was formed on a substrate 20 were produced using a film-forming apparatus 10 using a pulse discharge of FIG. 3. Substrate 20 was any of cemented carbide, cemented carbide having an intermediate layer 23, Ta, Mo, Nb, high speed steel, or Al. Film-forming apparatus 10 was adjusted such that a pulse discharge condition satisfied the following [A] or [B]. While a discharge electrode 1 was vibrated at 30 Hz, 60 Hz, or 90 Hz, discharge electrode 1 was rubbed against a surface 21 of substrate 20 to cause discharge electrode 1 to scan surface 21.

[A] A voltage between discharge electrode 1 and substrate 20: greater than 50 V; and a pulse width: less than 10 microseconds

[B] The voltage between the discharge electrode and the substrate: greater than 125 V; and the pulse width: less than 1 millisecond When each Sample was examined by the Raman spectrometric method, areas having different characteristics were formed in a marble form. The results of examining the peaks of the areas are shown in Tables 5 and 6. In each Sample, a first area, a second area, and a fourth area were observed, and some samples included also a third area. The first area is an area including a portion where a D band and a G band are mixed. The second area is an area including a portion satisfying [Condition III-A] or [Condition III-B]. The third area is an area including a portion satisfying [Condition III-C]. The fourth area is an area including a portion satisfying any of [condition IV-A] to [Condition IV-I] (the same as an N band area).

TABLE 5

| Sample | Discharge voltage (V) | Pulse width (msec) | Substrate material (% by mass) | Vibration frequency of electrode (Hz) | Raman peak (1) (Unit: cm$^{-1}$) Peak position | Raman peak (1) (Unit: cm$^{-1}$) Half-value width | Raman peak (2) (Unit: cm$^{-1}$) Peak position | Raman peak (2) (Unit: cm$^{-1}$) Half-value width | Peak ratio (D/G) | Area ratio (%) |
|---|---|---|---|---|---|---|---|---|---|---|
| 5-1 | 200 | 0.5 | WC:Co (10%) | 60 | 1346 | 60 | 1577 | 45 | 2.5 | 73 |
| 5-2 | 250 | 0.7 | Ni/WC:Co (10%) | 60 | 1347 | 55 | 1580 | 55 | 2.3 | 80 |
| 5-3 | 280 | 0.6 | TiN/WC:Co (10%) | 90 | 1348 | 55 | 1578 | 57 | 2.2 | 76 |
| 5-4 | 110 | 0.008 | WC:Co (20%) | 60 | 1352 | 160 | 1511 | 120 | 1.9 | 53 |
| 5-5 | 110 | 0.009 | Ni/WC:Co (10%) | 60 | 1354 | 240 | 1516 | 125 | 1.7 | 48 |
| 5-6 | 110 | 0.007 | TiN/WC:Co (20%) | 60 | 1357 | 180 | 1595 | 110 | 0.9 | 60 |
| 5-7 | 150 | 0.01 | Ta (100%) | 60 | 1348 | 41 | 1578 | 55 | 4.8 | 64 |
| 5-8 | 150 | 0.01 | Mo (100%) | 30 | 1347 | 58 | 1584 | 45 | 2.8 | 66 |
| 5-9 | 180 | 0.09 | Nb (100%) | 60 | 1345 | 64 | 1587 | 52 | 3.4 | 72 |
| 5-10 | 180 | 0.08 | High speed steel | 60 | 1346 | 68 | 1583 | 44 | 1.7 | 68 |
| 5-11 | 180 | 0.05 | Al | 60 | 1342 | 72 | 1570 | 53 | 1.8 | 62 |

TABLE 6

| | Second area | | | Third area | | | Fourth area | | | | |
|---|---|---|---|---|---|---|---|---|---|---|---|
| | Raman peak (Unit: cm$^{-1}$) | | Area ratio (%) | Raman peak (Unit: cm$^{-1}$) | | Area ratio (%) | Raman peak (Unit: cm$^{-1}$) | | Raman peak (Unit: cm$^{-1}$) | | Area ratio (%) |
| Sample | Peak position | Half-value width | | Peak position | Half-value width | | Peak position | Half-value width | Peak position | Half-value width | |
| 5-1 | 1355 | 170 | 26.5 | — | — | — | 912 | 63 | 92 | 4 | 0.5 |
| 5-2 | 1353 | 190 | 18 | 1331 | 5 | 1.7 | 916 | 58 | 93 | 4 | 0.3 |
| 5-3 | 1357 | 200 | 21.8 | 1331 | 6 | 2.1 | 908 | 51 | 2327 | 2 | 0.1 |
| 5-4 | 1341 | 70 | 27 | — | — | — | 805 | 55 | 705 | 68 | 20 |
| 5-5 | 1343 | 68 | 28 | — | — | — | 807 | 58 | 131 | 7 | 24 |
| 5-6 | 1348 | 43 | 23 | — | — | — | 800 | 48 | 99 | 5 | 17 |
| 5-7 | 1351 | 160 | 21 | — | — | — | 887 | 50 | 98 | 5 | 15 |
| 5-8 | 1353 | 180 | 22 | — | — | — | 910 | 55 | 95 | 5 | 12 |
| 5-9 | 1358 | 220 | 26 | — | — | — | 914 | 68 | 94 | 4 | 2 |
| 5-10 | 1357 | 190 | 27 | — | — | — | 904 | 59 | 95 | 4 | 5 |
| 5-11 | 1361 | 250 | 30 | — | — | — | 909 | 48 | 109 | 5 | 8 |

Figure 5:
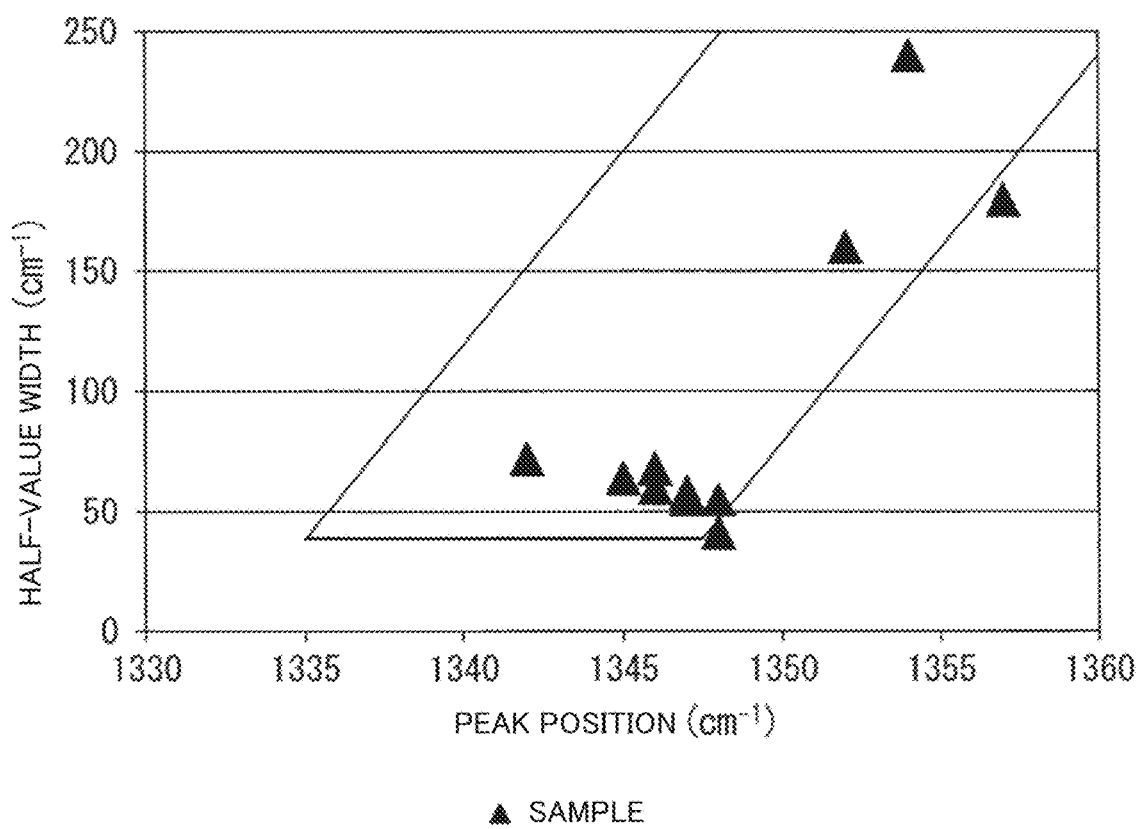
FIG. 5 is a graph showing the relationship between a peak position of a D band of each sample of Test 5 and a half-value width at the peak position.
Figure 6:
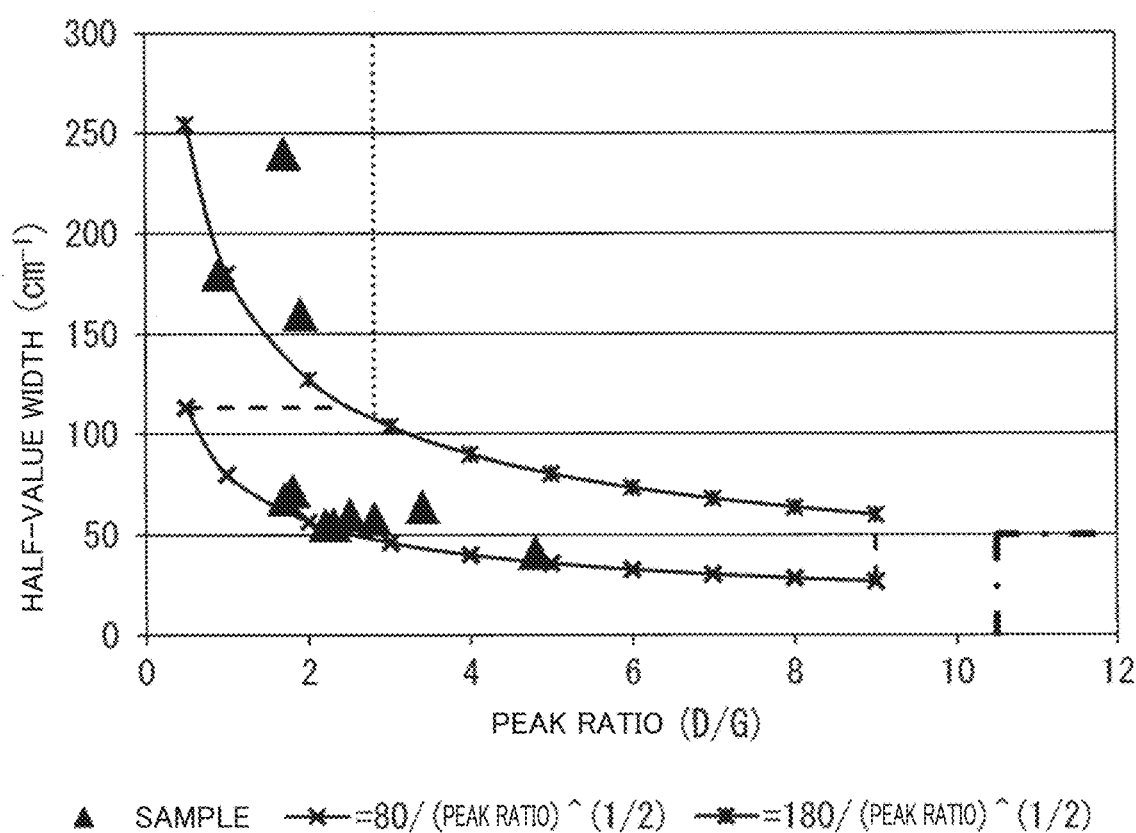
FIG. 6 is a graph showing the relationship between a D/G ratio of each sample of Test 5 and a half-value width in the D band.

Graphs in which the results of Table 5 (results of the first area) are plotted are shown in FIGS. 5 and 6. The horizontal axis of the graph of FIG. 5 shows the peak position (cm$^{-1}$) of the Raman peak (1); the vertical axis shows the half-value width (cm$^{-1}$) of the Raman peak (1); and a portion surrounded by a rhombus-shaped thin line is a range satisfying [Condition I]. Meanwhile, the horizontal axis of the graph of FIG. 6 is D/G, and the vertical axis is the half-value width (cm$^{-1}$) of the Raman peak (1). A portion surrounded by two curves in FIG. 6, a horizontal broken line indicating the position of the half-value width of 115 cm$^{-1}$, and a vertical broken line indicating the position of D/G of 9.0 is a range satisfying [Condition II-A]. A portion surrounded by a horizontal broken line indicating the position of a half-value width of 115 cm$^{-1}$ in FIG. 6 and a vertical dotted line indicating the position of D/G of 2.8 is a range satisfying [Condition II-B].

As shown in FIG. 5, most of Samples satisfy [Condition I], but some Samples do not satisfy [Condition I]. However, as shown in FIG. 6, it was found that all the Samples satisfy [Condition II-A] or [Condition II-B], and the coating of each of all the Samples is hard carbon-based coating 22.

From the results of Table 5, Samples 5-4, 5-5, and 5-6 having a discharge voltage of 110 V tended to have a higher Raman peak (1) than that of other sample having a discharge voltage of greater than 125 V. Samples 5-4, 5-5, and 5-6 satisfy [Condition III-B], and the other samples satisfy [Condition III-A].

From the results of Tables 5 and 6, it was found that, in hard carbon-based coating 22 of each of all the samples, the ratio of the first area is greater than or equal to about 50%, and the ratio of the second area is about 20 to 30%.

<<Test 6>>

In Test 6, Samples 6-1 to 6-5 having a hard carbon-based coating 22 were produced using the same method as in Test 5 except that a film formation atmosphere was 100% nitrogen. A substrate 20 was any of Ta, Mo, Nb, high speed steel, or Al. A voltage between a discharge electrode and the substrate was greater than 125 V, and a pulse width was less than 1 millisecond. The vibration frequency of a discharge electrode 1 was 30 Hz or 60 Hz. Table 7 shows the film forming condition of each Sample and the nitrogen content of hard carbon-based coating 22. The nitrogen content in hard carbon-based coating 22 was determined by a general procedure using energy dispersive X-ray analysis. The nitrogen content is an average value in a 100 μm square including the center of the Sample (two-dimensional center of gravity of the coating region). It was confirmed by a Raman spectrometric method that all hard carbon-based coatings 22 satisfy [Condition I] and [Condition II-A],

TABLE 7

| Sample | Discharge voltage (V) | Pulse voltage width (msec) | Substrate material (% by mass) | Vibration frequency of electrode (Hz) | Nitrogen content (atom %) |
|---|---|---|---|---|---|
| 6-1 | 150 | 0.01 | Ta (100%) | 60 | 10 |
| 6-2 | 150 | 0.01 | Mo (100%) | 30 | 7 |
| 6-3 | 180 | 0.09 | Nb (100%) | 60 | 8 |
| 6-4 | 180 | 0.08 | High speed steel | 60 | 5 |
| 6-5 | 180 | 0.05 | Al | 60 | 6 |

As shown in Table 7, from the measurement results of the nitrogen contents of Samples 6-1 and 6-2, it was found that, as the vibration frequency of discharge electrode 1 increases, the amount of nitrogen contained in hard carbon-based coating 22 increases. From the results of Samples 6-3, 6-4, and 6-5, it was found that, as a pulse voltage width increases, the amount of nitrogen contained in hard carbon-based coating 22 increases.

<<Test 7>>

In Test 7, Samples 7-1 to 7-6 having a hard carbon-based coating 22 were produced in the same manner as in Test 5. Hard carbon-based coating 22 was formed on a substrate 20 using a film-forming apparatus 10 using a pulse discharge of FIG. 3. Substrate 20 was cemented carbide or Ta. A discharge voltage was 500 V or 800 V; a pulse voltage width was 0.7, 0.8, or 0.9; and the vibration frequency of a discharge electrode 1 was 180 Hz or 360 Hz. Table 8 shows the film forming condition of each sample and the measurement result of a Raman spectrometric method.

TABLE 8

| | | | | Raman spectrophotometry | | | | |
|---|---|---|---|---|---|---|---|---|
| | Discharge | Pulse voltage | Substrate | Vibration frequency of | Raman peak (1) (Unit: cm$^{-1}$) | | Raman peak (2) (Unit: cm$^{-1}$) | | Peak |
| Sample | voltage (V) | width (msec) | material (% by mass) | electrode (Hz) | Peak position | Half-value width | Peak position | Half-value width | ratio (D/G) |
| 7-1 | 500 | 0.7 | WC:Co (10%) | 180 | 1357 | 19 | 1582 | 41 | 220 |
| 7-2 | 800 | 0.8 | WC:Co (10%) | 180 | 1357 | 17 | — | — | >5000 |
| 7-3 | 500 | 0.7 | WC:Co (10%) | 360 | 1350 | 15 | — | — | >5000 |
| 7-4 | 500 | 0.7 | Ta (100%) | 180 | 1358 | 18 | 1584 | 50 | 660 |
| 7-5 | 800 | 0.9 | Ta (100%) | 180 | 1356 | 14 | — | — | >5000 |
| 7-6 | 500 | 0.7 | Ta (100%) | 360 | 1349 | 12 | — | — | >5000 |

As shown in Table 8, Samples 7-1 to 7-6 all satisfied [Condition II-C]. Condition II-C stipulates that the half-value width of a D band (Raman peak (1)) is less than 50 cm$^{-1}$, and that D/G is greater than 10.5 (see a portion surrounded by a dashed-dotted line shown in the graph of FIG. 6). The D/G of each of Samples 7-1 to 7-6 is an extremely large value. That is, in Samples 7-1 to 7-6, the D band is extremely dominant. Since the D band is a band corresponding to an SP3 bond and an SP3-like bond, hard carbon-based coating 22 of each of Samples 7-1 to 7-6 is a coating having extremely large ratios of the SP3 bond and the SP3-like bond.

In Test 7, the discharge voltage is set higher than that in Test 5. This is presumed to contribute to an increase in the D/G of hard carbon-based coating 22. In particular, it is found that, when Samples 7-1 and 7-2 are compared with each other, D/G largely increases as the discharge voltage increases. By comparing Sample 7-4 and Sample 7-6 with each other, it was found that D/G can be increased by increasing the vibration frequency of discharge electrode 1.

<<Test 8>>

In Test 8, Samples 8-1 to 8-12 having a hard carbon-based coating 22 were produced in the same manner as in Test 5. A substrate 20 was Ta, Cu, or Al. A discharge voltage was 100 V, 102 V, 105 V, or 108 V; a pulse voltage width was 0.005 msec, 0.007 msec, 0008 msec, or 0.009 msec; and the vibration frequency of a discharge electrode 1 was 90 Hz or 120 Hz. Table 9 shows the film forming condition of each sample and the measurement result of a Raman spectrometric method. In hard carbon-based coating 22 of each sample, a fourth area (a portion satisfying any of [Condition IV-A] to [Condition IV-I]) had the largest area. Therefore, Table 9 shows only the measurement results of the fourth area. Table 9 also shows a ratio (N/D) of the peak intensity of an N band to the peak intensity of a D band.

TABLE 9

| | | | | | Raman spectrophotometry | | | | | |
|---|---|---|---|---|---|---|---|---|---|---|
| | Discharge | Pulse voltage | Substrate | Vibration frequency of | Raman peak (Unit: cm$^{-1}$) | | Raman peak (Unit: cm$^{-1}$) | | Peak | Ratio Area |
| Sample | voltage (V) | width (msec) | material (% by mass) | electrode (Hz) | Peak position | Half-value width | Peak position | Half-value width | ratio (N/D) | ratio (%) |
| 8-1 | 100 | 0.005 | Ta (100%) | 90 | 906 | 52 | 93 | 5 | 4.5 | 92 |
| 8-2 | 100 | 0.005 | Cu (100%) | 90 | 805 | 38 | 895 | 52 | 5.2 | 87 |
| 8-3 | 100 | 0.005 | Al (100%) | 90 | 912 | 60 | 108 | 6 | 2.7 | 83 |
| 8-4 | 102 | 0.007 | Ta (100%) | 90 | 807 | 43 | 700 | 69 | 3.2 | 75 |
| 8-5 | 102 | 0.007 | Cu (100%) | 90 | 888 | 52 | 98 | 5 | 2.3 | 77 |
| 8-6 | 102 | 0.007 | Al (100%) | 120 | 2327 | 3 | 100 | 48 | 1.9 | 53 |
| 8-7 | 105 | 0.008 | Ta (100%) | 90 | 800 | 47 | 250 | 45 | 1.5 | 55 |
| 8-8 | 105 | 0.008 | Cu (100%) | 90 | 909 | 58 | 104 | 6 | 0.9 | 68 |
| 8-9 | 105 | 0.008 | Al (100%) | 90 | 250 | 38 | 100 | 5 | 0.8 | 60 |
| 8-10 | 108 | 0.009 | Ta (100%) | 90 | 100 | 5 | 130 | 7 | 0.55 | 43 |
| 8-11 | 108 | 0.009 | Cu (100%) | 120 | 910 | 56 | 2330 | 2 | 0.4 | 48 |
| 8-12 | 108 | 0.009 | Al (100%) | 120 | 914 | 62 | 2327 | 2 | 0.35 | 51 |

As shown in Table 9, the fourth area in which portions satisfying two of Samples 8-1 to 8-12 [Condition IV-A] to [Condition IV-I] are mixed occupies the majority. This peak is a peak close to a Raman peak such as carbon nanotube or fullerene. In Test 8, the discharge voltage is set to about 100 V to 110 V; and the vibration frequency of discharge electrode 1 is set to about 90 Hz to 120 Hz. That is, in Test 8, the discharge voltage is set lower than that in Test 5. This is presumed to contribute to an increase in the fourth area in hard carbon-based coating 22.

It should be understood that the embodiments disclosed herein are illustrative and non-restrictive in all respects. The scope of the present invention is defined by the claims, rather than the embodiments above, and is intended to include any modifications within the meaning and scope equivalent to the claims.

REFERENCE SIGNS LIST

10: film-forming apparatus
11: charge circuit
11r: variable resistance
11c: variable capacitor
12: discharge circuit
12r: resistance 12*i*: inductor
13: discharge control unit
1: discharge electrode
2: member provided with coating
20: substrate
21: surface
22: hard carbon-based coating
23: intermediate layer
3: support electrode
4: power supply device
5: bias power supply
6: vibration device

The invention claimed is:

1. A method for manufacturing a hard carbon-based coating, the method comprising:
   a step A of preparing a film-forming apparatus including a power supply device and a discharge electrode containing a carbon material, and a substrate having a surface on which a coating is to be formed;
   a step B of causing the film-forming apparatus to repeatedly generate a discharge between the discharge electrode and the substrate, to form the hard carbon-based coating consisting of an electrode material of the discharge electrode on the surface,
   wherein the discharge electrode is vibrated to generate a periodic discharge;
   the power supply device is an AC power source; and
   an AC voltage applied to the discharge electrode is greater than or equal to 7.5 kV at a frequency of 50 Hz to 60 Hz, the discharge electrode being vibrated at 30 Hz to 90 Hz, and the discharge electrode being rubbed against the surface of the substrate to cause the discharge electrode to scan the surface of the substate.

2. The method for manufacturing a hard carbon-based coating according to claim 1, wherein the substrate is composed of cemented carbide, an iron-based material, a boron carbon nitride-based material, a cubic boron nitride-based material, cermet, a Ni-based material, or conductive ceramic.

3. The method for manufacturing a hard carbon-based coating according to claim 1, wherein the discharge electrode is a carbon material containing greater than or equal to 90% by mass of carbon.

* * * * *